(12) United States Patent
Kulshreshtha et al.

(10) Patent No.: US 10,169,501 B1
(45) Date of Patent: *Jan. 1, 2019

(54) TIMING CONTEXT GENERATION WITH MULTI-INSTANCE BLOCKS FOR HIERARCHICAL ANALYSIS

(71) Applicant: Cadence Design Systems, Inc., San Jose, CA (US)

(72) Inventors: Pawan Kulshreshtha, San Jose, CA (US); Amit Dhuria, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/182,353

(22) Filed: Jun. 14, 2016

(51) Int. Cl.
*G06F 17/50* (2006.01)

(52) U.S. Cl.
CPC ................ *G06F 17/5031* (2013.01)

(58) Field of Classification Search
CPC ........... H01L 29/42324; H01L 29/7881; G06F 3/005; G06F 3/017; G06F 3/041; G06F 3/0412; G06F 3/0416; G06F 3/04847; G06F 3/0488; G06F 3/04883; G06F 17/5068; G06F 3/0418; G06F 3/0436; G06F 9/5072; G06F 17/5045; G06F 19/24; G06F 19/28; G06F 3/0605; G06F 12/0877; G06F 13/1694; G06F 17/302; G06F 19/18; G06F 19/22; G06F 17/5031; G06F 2217/84; C12Q 2565/607; C12Q 1/6869; C12Q 1/6874; C12Q 2565/301; C12Q 2565/629

USPC .................................................. 716/100–108
See application file for complete search history.

(56) References Cited

U.S. PATENT DOCUMENTS

| 8,601,420 | B1 | 12/2013 | Keller et al. | |
| 2009/0013292 | A1* | 1/2009 | Brunet | G06F 17/5031 716/113 |
| 2010/0095259 | A1* | 4/2010 | Tetelbaum | G06F 17/5031 716/113 |
| 2012/0124534 | A1* | 5/2012 | Kalafala | G06F 17/504 716/108 |
| 2015/0310151 | A1 | 10/2015 | Hathaway et al. | |

OTHER PUBLICATIONS

U.S. Appl. No. 15/182,338, Non Final Office Action dated Jul. 3, 2017, 15 pgs.

* cited by examiner

*Primary Examiner* — Binh Tat
(74) *Attorney, Agent, or Firm* — Schwegman Lundberg & Woessner, P.A.

(57) ABSTRACT

Electronic design automation systems, methods, and media are presented for hierarchical timing analysis with multi-instance blocks. Some embodiments involve generation of a combined timing context for instances of a multi-instance block. Such embodiments may merge timing context information with multi-mode multi-context (MMMC) views for different instances of a multi-instance block. Other embodiments involve efficient merging of instance timing contexts during block level static timing analysis. Various different embodiments involve separate or hybrid merged timing analysis based on a user selection.

20 Claims, 15 Drawing Sheets

TIMING CONTEXT GENERATION WITH MULTI-INSTANCE BLOCKS FOR HIERARCHICAL ANALYSIS

TECHNICAL FIELD

Embodiments described herein relate to electronic design automation (EDA), and to systems, methods, devices, and instructions for performing timing analysis as part of generation of circuit designs.

BACKGROUND

Electronic design automation (EDA) is a category of systems for assisting with the design of electronic systems and devices. Large, integrated circuit designs are often assembled from previously designed blocks. This enables reduced turnaround times for generation of an integrated circuit. Schematic and layout information for such block portions of a design may be exchanged or licensed as intellectual property. Many circuits use parallel architectures where multiple instances of a design block are integrated into a single circuit die, or into multiple circuit dies in a single chip package. One example of a parallel architecture is a multi-core processor. A multi-core processor is a single computing component with two or more independent central processing units, which read and execute program instructions.

BRIEF DESCRIPTION OF THE DRAWINGS

Various ones of the appended drawings merely illustrate example embodiments of the present disclosure and should not be considered as limiting its scope.

DETAILED DESCRIPTION

Example embodiments described herein relate to methods, computer media, and devices used for analyzing and optimizing circuit designs having multiple instances of a particular design block. While certain example embodiments are discussed, it will be apparent that other embodiments not specifically described herein, including embodiments using hierarchical timing analysis performed at any stage of a circuit design, are possible in accordance with the various embodiments presented herein.

To ensure that a circuit design works as planned, a design team uses static timing analysis to determine if the various clocks and signals within a circuit design are correctly implemented. Incorrect implementation of timing may prevent a circuit from functioning. Flat analysis of timing within an integrated circuit uses analysis of every element and wire in the design. As system on a chip (SoC) designs grow in complexity due to mare gates, functionality, operating modes, and expected operating conditions, a flat analysis of timing may involve an unmanageably large amount of memory and analysis time. In a hierarchical approach, blocks of logic are grouped together within a circuit design. These blocks are then modeled as timing abstractions within the design. Even with such hierarchical analysis, timing analysis for large circuit designs may use extensive time and processing resources, and simplifications to limit such resource usage may result in pessimistic analysis.

Embodiments described herein include systems and methods of hierarchical timing analysis configured for accuracy and efficiency. In some embodiments, multiple operating modes and operating conditions are considered as part of a multi-mode multi-corner (MMMC) analysis for generating timing constraints using structures not present in previous hierarchical timing analysis systems. Further, some embodiments include systems and methods for "hybrid" merging of MMMC views and timing constraints. Such hybrid merging identifies compatible timing contexts to simplify analysis of different instances where it is possible to generate accurate and efficient timing analysis results for multi-instance blocks in a circuit design.

Figure 1:
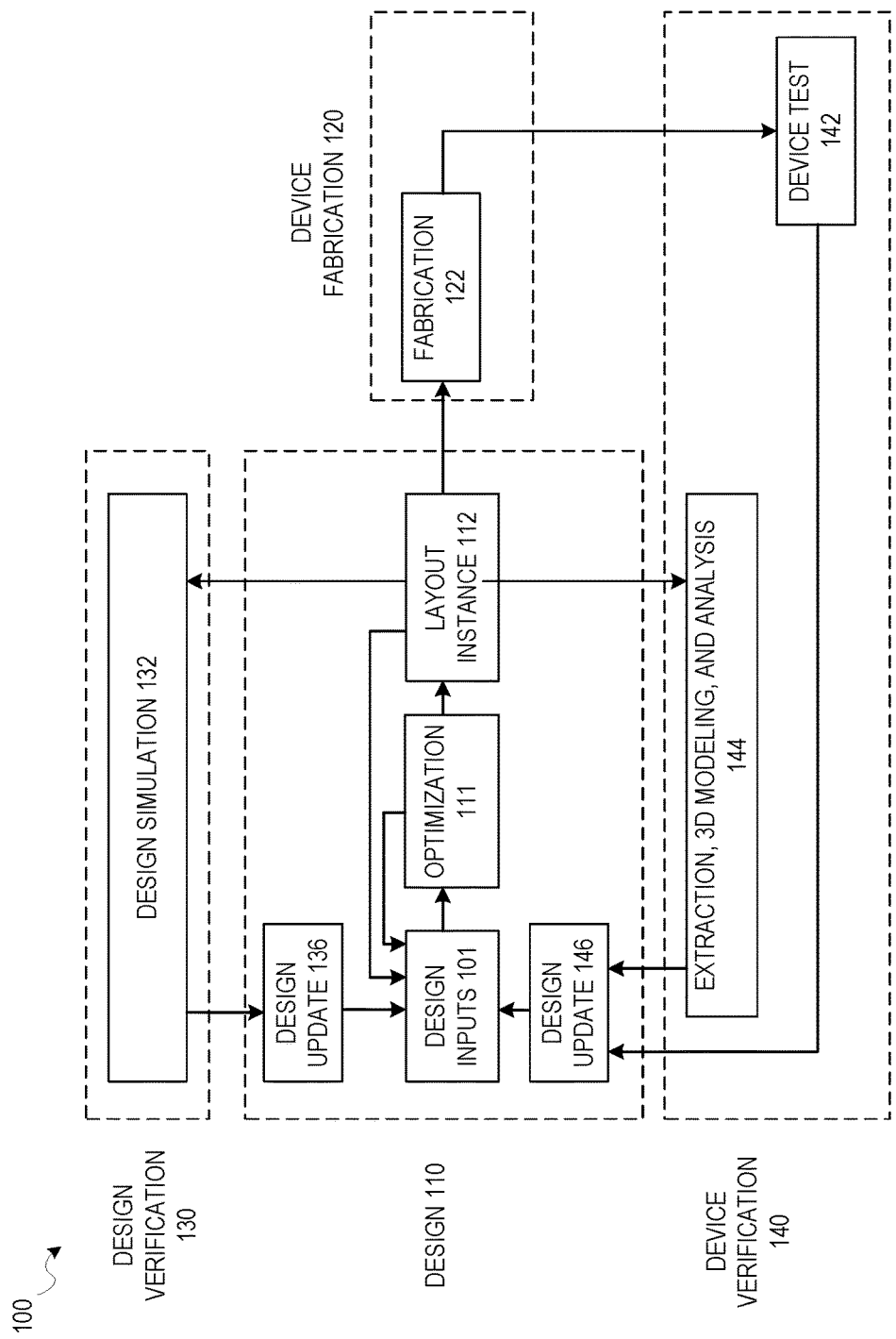
FIG. 1 is a diagram illustrating one possible design process flow for generating a circuit including embodiments to meet timing constraints according to some embodiments.

FIG. 1 is a diagram illustrating one possible design process flow for generating a circuit including embodiments to meet timing constraints according to some embodiments. This includes possible design process flows for timing and signal integrity analysis to generate a circuit design and an associated circuit in accordance with various example embodiments. It will be apparent that other design flow operations may function using the timing constraints and optimizations described herein, but design flow 100 is described here for the purposes of illustration. As illustrated, the overall design flow 100 includes a design phase 110, a device fabrication phase 120, a design verification phase 130, and a device verification phase 140. The design phase 110 involves an initial design input operation 101 where the basic elements and functionality of a device are determined, as well as revisions based on various analyses and optimization of a circuit design. This design input operation 101 is where instances of a multi-instance block are used in the circuit design and any additional circuitry for the design around the blocks is selected. The initial strategy, tactics, and context for the device to be created are also generated in the design input operation 101, depending on the particular design algorithm to be used.

In some embodiments, following an initial selection of design values in design input operation 101, timing analysis and optimization according to various embodiments occurs in an optimization operation 111, along with any other automated design processes. As described below, design constraints for blocks of a circuit design generated with design inputs in design input operation 101 may be analyzed using hierarchical timing analysis according to various embodiments. While design flow 100 shows such optimization occurring prior to layout instance 112, such hierarchical timing analysis and optimization may be performed at any time to verify operation of a circuit design. For example, in various embodiments, constraints for blocks in a circuit design may be generated prior to routing of connections in a circuit design, after routing, during register transfer level (RTL) operations, or as part of a final signoff optimization or verification prior to a device fabrication operation 122.

After design inputs are used in design input operation 101 to generate a circuit layout, and any optimization operations 111 are performed, a layout is generated in layout instance 112. The layout describes the physical layout dimensions of the device that match the design inputs. This layout may then be used in a fabrication operation 122 to generate a device, or additional testing and design updates may be performed using designer inputs or automated updates based on the design simulation 132 operations or 3D modeling and analysis 144 operations. Once the device is generated, the device can be tested as part of device test 142 operations, and layout modifications generated based on actual device performance.

As described in more detail below, design updates 136 from design simulation 132, design updates 146 from device test 142 or 3D modeling and analysis 144 operations, or direct design input operation 101 may occur after an initial layout instance 112 is generated. In various embodiments, whenever design inputs are used to update or change an aspect of a circuit design, a timing analysis and optimization operation 111 may be performed.

For example, in various embodiments, a user may provide an input to an EDA computing device indicating placement of an instance of a multi-instance block within a first portion of a circuit design. Once a design is ready, another input to the EDA computing device may be used to generate constraints for each instance of the multi-instance block, and a timing analysis may be performed using the constraints. An output to a display of the EDA computing device may show results of the timing analysis, or may show optimizations recommended or automatically performed adjustments to the circuit design based on the timing analysis. Further inputs to the EDA computing device may involve adjustments such as user design inputs, with additional timing analysis and optimization initiated via user operation of the EDA computing device.

Figure 2:
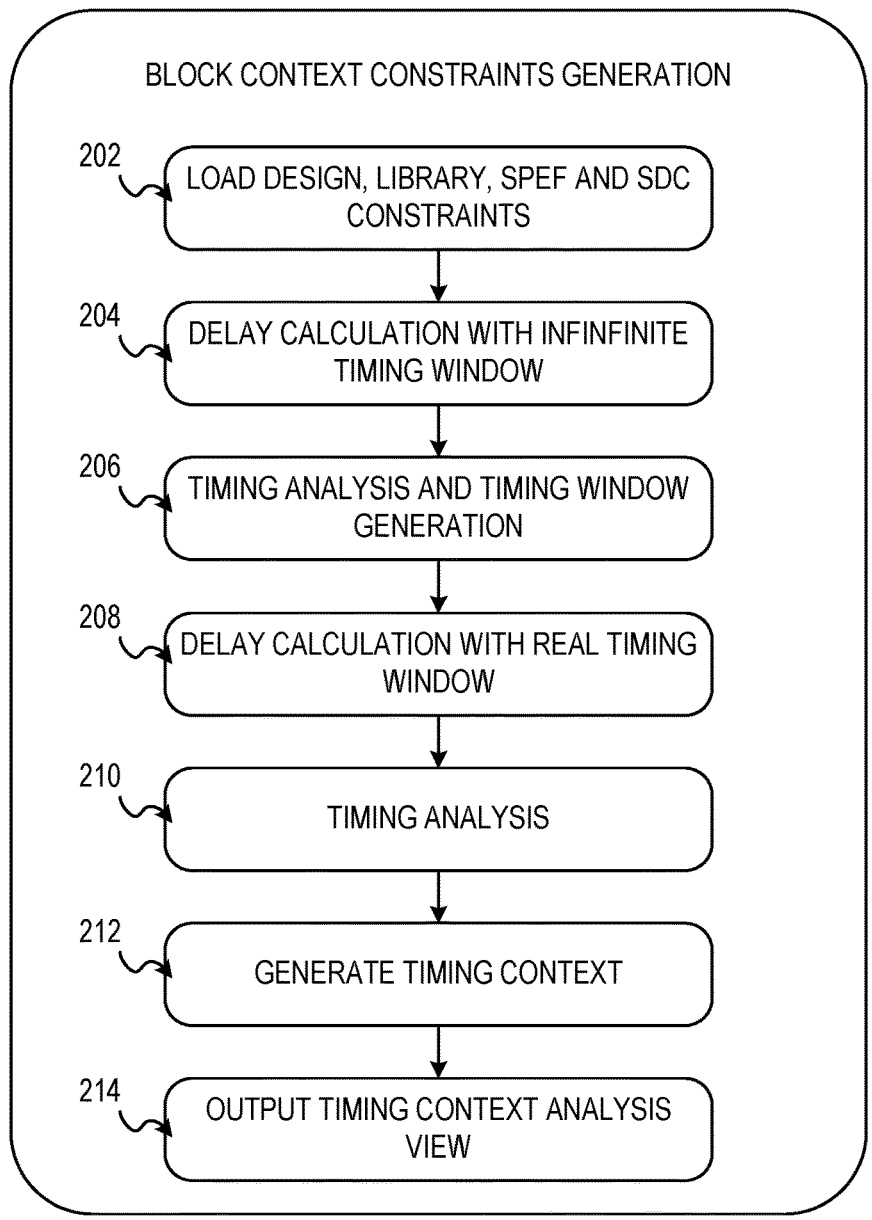
FIG. 2 illustrates aspects of block context constraints generation and timing report generation, in accordance with some embodiments.

FIG. 2 illustrates aspects of block context constraints generation and timing report generation, in accordance with some embodiments. In particular, block context constraints generation method 200 operates to generate timing contexts that are used for timing report generation in accordance with various embodiments. As part of method 200, aspects of static timing analysis (STA) flow with signal integrity are used. In operation 202, circuit design details and constraints are loaded into an EDA computing system. This includes information from a Standard Parasitic Exchange Format (SPEF) file and a specified library. This also includes extracting a netlist into a graph of "timing pins" and "timing arcs". Further, synopsys design constraint (SDC) files and associated information are read and the information is annotated to the graph.

Then, using the information loaded in operation 202, in operation 204, delay calculations are performed with infinite timing windows. The associated delays are annotated to the graph. Timing analysis is then performed and timing windows are generated for signal integrity (SI) analysis in operation 206. Subsequently, another delay calculation with a real timing window is performed and final delays are annotated to a timing graph in operation 208. This information is part of the overall timing context for a block, which is the basis for individual timing contexts for instances of a block as influenced by the elements of the circuit design around a particular instance. In operation 210, various timing analysis calculations described herein are performed, and in operation 212, timing contexts for individual instances of a block are generated.

In some embodiments, an STA tool of an EDA computing device is used to perform portions of method 200, including operations 204-210. In such embodiments, the STA tool adds "tags" for internal analysis and feature support for a multi-instance block. Then in operation 212, boundary conditions on input ports, the arrival times, and any other such information for instances of a multi-instance block are initialized based on a user supplied SDC file. As part of such initialization, differences in input conditions for individual blocks of the multi-instance block are considered, as well as the impact of different surrounding design elements on different instances of the multi-instance block, and this timing information is then propagated forward on the graph in an object called "phase". As the "phase" propagates forward through the design it accumulates delays into arrival times and picks up or drops the "tags" along the way. This information about how a signal operates within an instance of a design block (e.g. an instance of a multi-instance block of a circuit design) is referred to as a timing context for an individual instance.

In some embodiments, method 200 may be considered as follows: after full flat timing analysis (e.g. operations 202-210), timing context is derived for each instance of a multi-instance block (e.g. operation 212). Timing context consists of boundary conditions at inputs and outputs. At inputs, constraints for data arrival times, clock arrival times, phase tags representing upstream path constraints, driver information, external parasitics and external timing window aggressors are generated. Similarly at outputs, data required times (e.g. timing requirements as part of system design parameters), phase tags representing downstream path constraints, external parasitics and external timing window aggressors are generated. Also, common clock path pessimism removal (cppr) adjustment constraints are generated for common points outside the block.

Each instance of the multi-instance block is associated with a different timing context. This allows separate treatment of each individual block within the design to adjust the circuitry around or in the block to meet timing requirements. Some circuit designs may have many block instances (e.g. 40 instances, 100 instances, etc.) originating from one or more multi-instance blocks.

Additionally, in multi-mode, multi-corner analysis (MMMC), each scenario, which consists of an operating mode and a condition corner, is represented by a MMMC view. An MMMC view is a combination of a mode and an operating condition. As part of method 200, the calculations of operations 204-210 are performed to generate information for each MMMC view and each instance. In operation 212, this information is used to generate timing contexts for each MMMC view for each instance. In other words, each combination of operating condition (e.g. temperature conditions, power fluctuation conditions, etc.) and operating modes (e.g. low power modes, standby modes, normal modes, etc.) is associated with the timing information described above to generate a timing context particular to an instance under a particular MMMC condition.

For example, in one embodiment, a circuit design has ten instances of a multi-instance block. In various embodiments, this may be the same multi-instance block or different multi-instance blocks. The design constraints include three voltage condition corners (e.g. high, low, and typical), three temperature conditions (e.g. high, low, and typical), five interconnect conditions (e.g. maximum capacitance, minimum capacitance, maximum resistance times capacitance (RC), maximum RC, and typical), and two operating modes. Thus, the design has ninety (e.g. 3×3×5×2=90) MMMC views. Each instance of the circuit design has a timing context for each MMMC view, so the total number of timing contexts for such an embodiment is 900.

Following generation of the timing contexts in operation 212, in operation 214 the timing context information is stored in a memory of the EDA computing device as an analysis view output file. In method 200, operation 214 involves storing the context information in an analysis view output file that comprises the timing contexts for each different instance and associated MMMC view. Various embodiments, such as the embodiment of method 200, generate a combined timing context for all instances of a multi-instance block. In such embodiments, for each instance of a multi-instance block, timing context is generated for all MMMC views. Instance timing context for a MMMC view is represented by a new MMMC view derived from the original MMMC view. The new MMMC view inherits everything from the original MMMC view. A new attribute is added to each new MMMC view which represents the timing context of the instance. Timing context information for all instances of a multi-instance block represented by the new MMMC views is dumped into a file using MMMC infrastructure. In some such embodiments, an EDA computing device is configured to receive an MMMC command to attach timing context constraints to an MMMC view to generate the new MMMC view. Such a new MMMC view, in some embodiments, comprises timing contexts for each instance and each MMMC operating condition for a circuit design. Thus, as described above, an analysis view output file with constraints for all context MMMC views, in some embodiments, has total number of output context constraints of the analysis view file for the context MMMC views that equals a total number of MMMC views times a number of instances within the circuit design.

Figure 3:
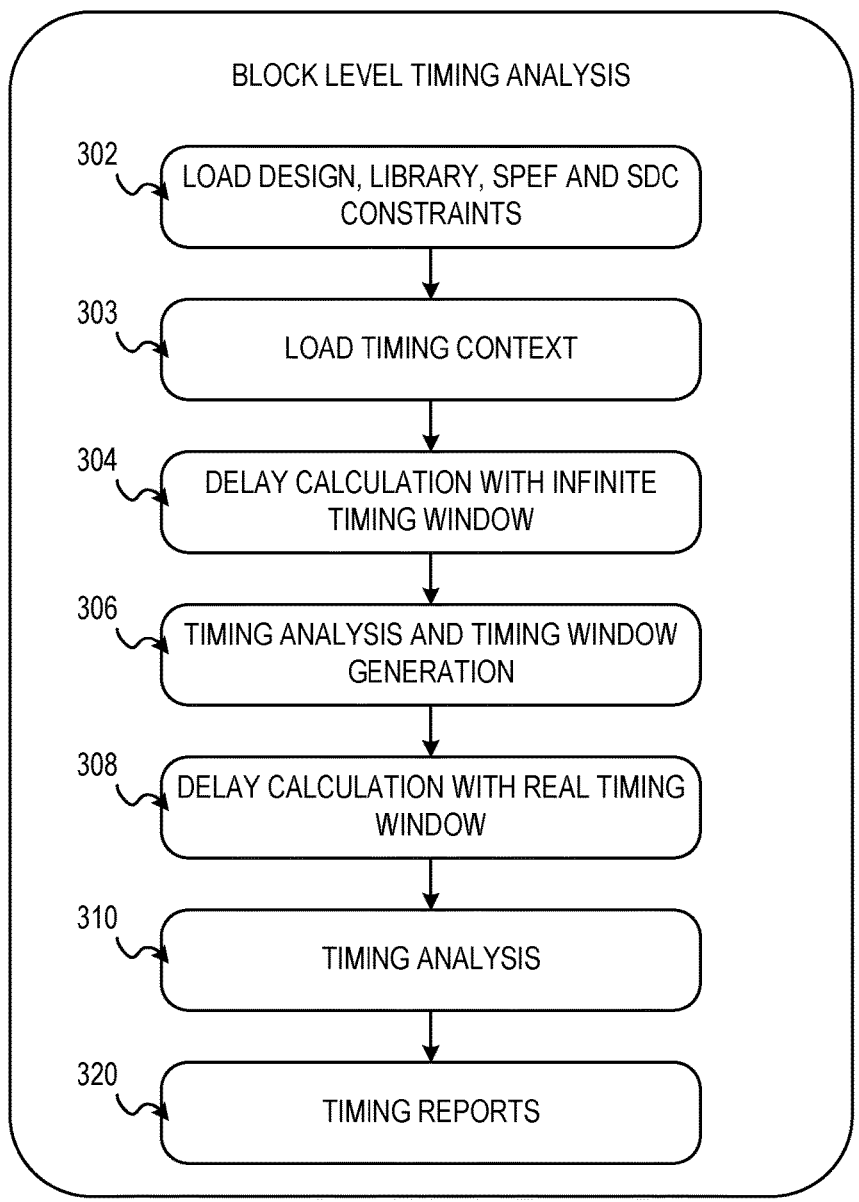
FIG. 3 illustrates aspects of block level timing analysis, in accordance with some embodiments.

FIG. 3 illustrates aspects of block level timing analysis, in accordance with some embodiments. In method 300, previously generated timing context information, such as the timing context of operation 212, is used to generate timing reports. In some embodiments, method 300 is performed on the same EDA computing device that performs method 200. In some embodiments, method 300 is performed separately on a different EDA computing device from the EDA computing device that generates the timing context used by method 300. Further, method 300 describes an analysis for an individual instance of a multi-instance block in a circuit design. In some embodiments, method 300 is repeated on the same EDA computing device for multiple instances, whereas in other embodiments, method 300 may be performed on different EDA computing devices for different instances of a single circuit design. Thus, in some embodiments, instances within a single circuit design may have timing analysis performed separately.

In method 300, operation 302 involves loading design, library, SPEF, and SDC constraints onto an EDA computing device. This may, in some embodiments, be similar or identical to operation 202 of method 200. Then, in operation 303, timing context information is loaded. Block level STA is then performed in operations 304-310 using the timing context for an instance from operation 303. As part of this block level STA, clock "phases" described above are propagated for each instance of a multi-instance block. For each clock input port of the instance, timing context clock constraints are processed and a "phase" is created for each clock of each instance. Clock latencies at the port are not added to the arrival time of the "phase" and instead a tag containing port latencies of all the instances is added to the "phase". Clock "phases" are propagated forward from all clock input ports to register clock pins and output ports. This structure is used to perform operations 304-310 for the instance of a multi-instance block being analyzed in a particular implementation of method 300, and this may be repeated for each instance in a circuit design. In operation 304, delay calculations are performed with a long (e.g. approximating infinite) timing window. In operation 306, timing analysis and timing window generation are performed. In operation 308, delay calculations are performed with a real timing window, and in operation 310, a timing analysis is performed. Following the STA of operations 304-310, timing reports are generated in operation 320.

In some embodiments with multiple different multi-instance blocks in a circuit design, multiple block level timing analysis sessions are run, with one session for each different multi-instance block within the circuit design. In such embodiments, the context generation of multiple blocks and the associated instances is performed in a top level hierarchical analysis, and the block-level analysis is run separately for different blocks. In other embodiments, the structure of the timing analysis may be organized differently.

Figure 4:
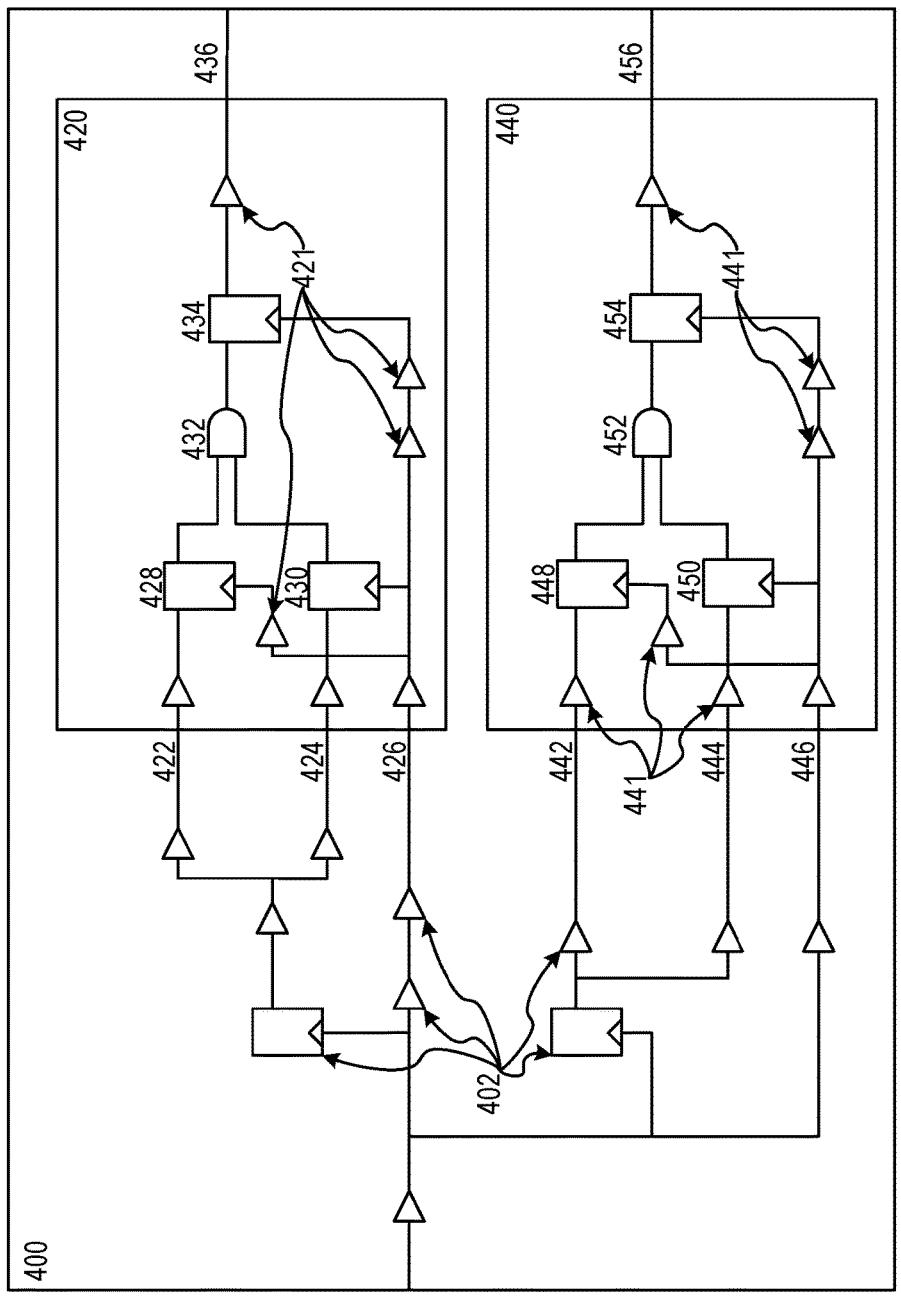
FIG. 4 illustrates an example circuit, including a multi-instance block, in accordance with some embodiments.

FIG. 4 illustrates an example circuit design 400 including instances 420, 440 of a multi-instance block, in accordance with some embodiments. In some embodiments, netlist data is accessible by an EDA computing device, with the netlist containing information describing circuit design 400. Circuit design 400 includes instance 420 and instance 440 of a first multi-instance block. While only a single multi-instance block is illustrated in the examples, different embodiments include any number of multi-instance blocks having any number of instances. Additionally, external circuit elements 402 are present in circuit design 400. This includes any elements of the circuit design outside of instances of a multi instance block.

Instance 420 has inputs 422, 424, clock input 426, output 436 and circuit elements 421, 428, 430, 432, and 434. Similarly, instance 440, which shares the same structure as instance 420 from the associated multi-instance block, includes inputs 442, 444, clock input 446, output 456, and circuit elements 441, 448, 450, 454, and 456.

As described above with respect to FIGS. 2 and 3, a circuit design such as circuit 400 may be processed by an EDA computing device to generate timing contexts, and these contexts may be analyzed as part of a timing analysis to generate timing reports. In one embodiment, a netlist for circuit design 400 may be loaded with library information, an SPEF, an SDC, and any other such information. This information may be used to identify propagation points within circuit design 400, and particularly within a multi-instance block. The MMMC context information is generated from the input information, and includes details related to timing for such propagation points. In some embodiments, the propagation points are the inputs and outputs of certain circuit elements, such as circuit elements 428, 430, 432, and 434. In other embodiments, any points within an instance of a block may be selected as propagation points, with all instances derived from the same block having similar corresponding propagation points. In some embodiments, this context information includes boundary conditions at inputs such as constraints for data arrival times, clock arrival times, phase tags representing upstream path constraints, driver information, external parasitics and external timing window aggressors, are generated. Similarly at outputs of circuit elements, for such embodiments, data required times, phase tags representing downstream path constraints, external parasitics and external timing window aggressors are generated as part of timing contexts. Once the timing context is generated, including context information for all MMMC views as described above, this information is used to propagate a "phase" through each instance of the block. Various timing analyses, including timing estimates using a hybrid merging processes, may be used as part of a hierarchical timing analysis. In various embodiments, common clock path pessimism removal (cppr) adjustment constraints are generated for common points outside the instances 420, 440 related to external circuit elements 402.

Figure 5:
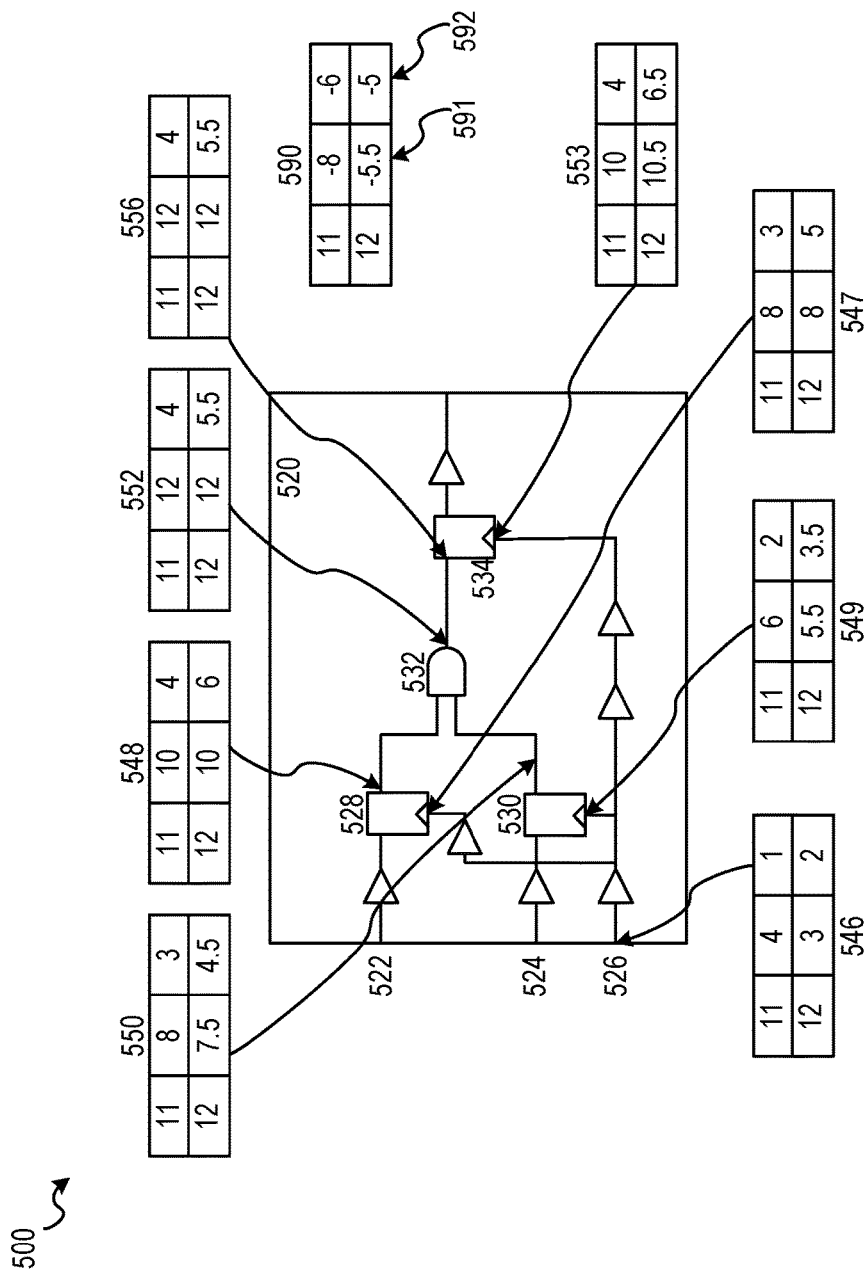
FIG. 5 illustrates aspects of timing and Multi-Mode Multi-Corner (MMMC) design for an example circuit including a multi-instance block, in accordance with some embodiments.

FIG. 5 illustrates aspects of timing and Multi-Mode Multi-Corner (MMMC) design for an example circuit including a multi-instance block, in accordance with some embodiments. FIG. 5 illustrates a block 520 with a shared structure for instances 420 and 440. FIG. 5 shows timing data propagated on clock and data paths for two instances of block 520. For the purposes of illustration, the propagated data illustrated in FIG. 5 is discussed with respect to FIG. 4. In various embodiments, the data may represent instances in a different circuit design from circuit design 400.

FIG. 5 shows multi-instance block 520 with inputs 522 and 524, clock input 526, output 536, and circuit elements 528, 530, 532, and 534. Propagation data is shown for progression points 546, 548, 549, 550, 552, 553, and 556, along with data for output slack values 590. This propagation data is different from timing data, in that it represents a "phase" difference at corresponding propagation points within different instances of the same block. Timing data includes differences at the inputs to the instances, whereas the propagation data represented in FIG. 5 represents differences between instances of the same block due to timing contexts described above.

Figure 6:
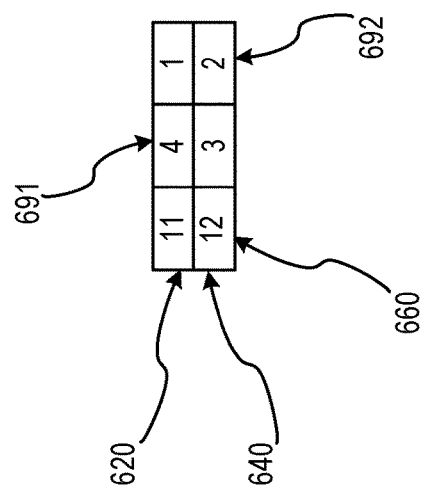
FIG. 6 illustrates aspects of timing and MMMC design, in accordance with some embodiments.

FIG. 6 illustrates aspects of data and MMMC design, in accordance with some embodiments. Data 600 of FIG. 6 illustrates the structure for timing data shown at propagation points 546, 548, 549, 550, 552, 553, and 556 in FIG. 5. Top row 620 includes data for a first instance of a multi-instance block with a first MMMC view. Lower row 640 includes data for a second instance of the block with the first MMMC view. While two instances are illustrated with the same MMMC view, in additional embodiments, timing data may be structured with multiple rows for the same instance having different MMMC views, or for combinations of any number of instances and any number of MMMC views, each instance and MMMC view combination having a separate row based on different timing context information particular to that instance and MMMC view. Thus, as described above, in some embodiments, an analysis view output filing having timing contexts for each combination of MMMC view and instance may be used, at least in part, to generate a separate row for timing data in a circuit design. The structure is the same, whether timing data (e.g. including input variations to an instance) is represented, or phase data (e.g. ignoring input variations between instances) is represented by data 600.

First column 660 includes an identifier for the different instances. In other embodiments, this includes an identifier unique to an instance and an MMMC view. For example, an embodiment with 5 instances and 10 MMMC views may have 50 different rows, each having an identifier in a first column 660. Second column 691 includes a late arrival value for the associated progression point in the instance. Third column 692 includes an early arrival value for the associated progression point.

The relative time values between different progression points in an instance are based on a combination of expected timing variation for the circuit elements within an instance (e.g. phase differences), as well as any impact of the surrounding circuit design (e.g. input timing differences). Progression values (e.g. the timing value along a path within an instance) for associated progression points in different instances may thus be different, even though the structure and circuit elements of instances are the same, due to the influence of surrounding circuit elements outside the instances on the phase within a particular instance. Similarly, the same instance may have different progression or phase values, based on the impact of MMMC view conditions on the instance.

In an embodiment where the timing data of FIG. 5 is described with respect to instances 420 and 440 of FIG. 4, with data from a top row 620 for instance 420, and data from a bottom row 640 for instance 440, the timing progresses along the data and clock paths as described for the corresponding progression points.

For example, at clock input 426 for instance 420 associated with progression point 546, a late arrival value is 4 and an early arrival value is 1. At corresponding clock input 446 for instance 440, the late arrival value is 3 and the early arrival value is 4. The propagated early time value to an input of circuit element 430 associated with progression point 530 is 2, and the late time value is 6. The propagated early time value to an input of circuit element 450 associated with progression point 530 is 3.5, and the late time value is 5.5. As is seen from the data, the particular early and late values for the different instances vary based on different inputs. Such differences are expected based on a different position of the instances within a larger circuit design. In addition to such differences, the changes in the values along the data and clock paths may be the same, or may be different. Differences in the change along the same progression path for different instances (e.g. from points corresponding to progression points 526 and 530) are based on timing context information as described above. Thus, for example, the early arrival value of 3.5 at progression point 549 is different from the early arrival value of 2 for instance 440 by a value of 1.5. The corresponding difference for instance 420 is a value of 1 (e.g., an early arrival value of 2 at progression point 549 and an early arrival value of 1 at progression point 546. This difference in progression for different instances (or different MMMC values of the same instance in other embodiments), is based on timing contexts.

Further, each individual instance as shown has both an early arrival value and a late arrival value that propagate through the system. For each propagation point, slack data 590 may be determined. A setup slack value is equal to the late data arrival value minus the early clock arrival value for circuit elements such as circuit element 534 that receives a data input at progression point 556 and a clock input at progression point 553. A hold slack value 592 is a late clock arrival value minus an early data arrival value. The slack data 590 is illustrated for circuit element 534, but similar slack data may be calculated for circuit elements 528 and 530, both of which have clock and data inputs. In some embodiments, each circuit element 528, 530, 534 having clock and data inputs have associated slack thresholds, and calculation of setup and hold slack values, as well as comparison of these values against the associated thresholds, is part of a timing report such as the timing reports of operation 320 discussed above. Such design threshold values for the setup slack and hold slack are received as part of the input information accessed by the EDA computing device. Similar slack values may be calculated for other elements with multiple inputs, such as circuit elements 732 having two data inputs.

In some embodiments, then, the full analysis at each progression point within every instance and MMMC view of a design may be used. In the example above, where the design constraints include three voltage conditions, three temperature conditions, five interconnect conditions, and two operating modes, for each of 10 instances, timing data for each progression point of a multi-instance block may have 900 rows, one for each unique combination of an instance and MMMC view. Similarly, slack data 590 may be calculated for each circuit element having both clock and timing inputs, so a block with 10 clocked circuit elements could have 9000 hold slack and 9000 setup slack calculations. As described above, each of these is based on particular timing contexts for the associated MMMC view and instance combination.

Some embodiments, however, may use a hybrid merge to simplify the number of calculations. In such embodiments, each column of timing data is associated with one or more merge thresholds. When "phase" or progression values for different instances are within a threshold value (e.g. the external impacts on each instance that cause operational differences between instances is below a threshold), then the values for these progression points are merged to the worse value (e.g. the value more likely to cause a timing failure or to fail to meet circuit design requirements). If there is uncertainty about which merged value is more likely to cause a design failure, then a merge is not performed. Similarly, if the differences are outside the threshold, then the values are not merged. Such a hybrid merging process, in some embodiments, simplifies timing calculations while maintaining a worst-case timing analysis.

In some such embodiments, merging is performed only on internal data paths. In such embodiments, these internal paths between data registers are used for merging to maintain full accuracy and for efficiency, as such paths are more likely to have differences that provide benefits through merging. Similarly, in some embodiments, merge operations are only performed on progression points at the input and output data pins of register devices or elements within a multi-instance block.

Figure 7:
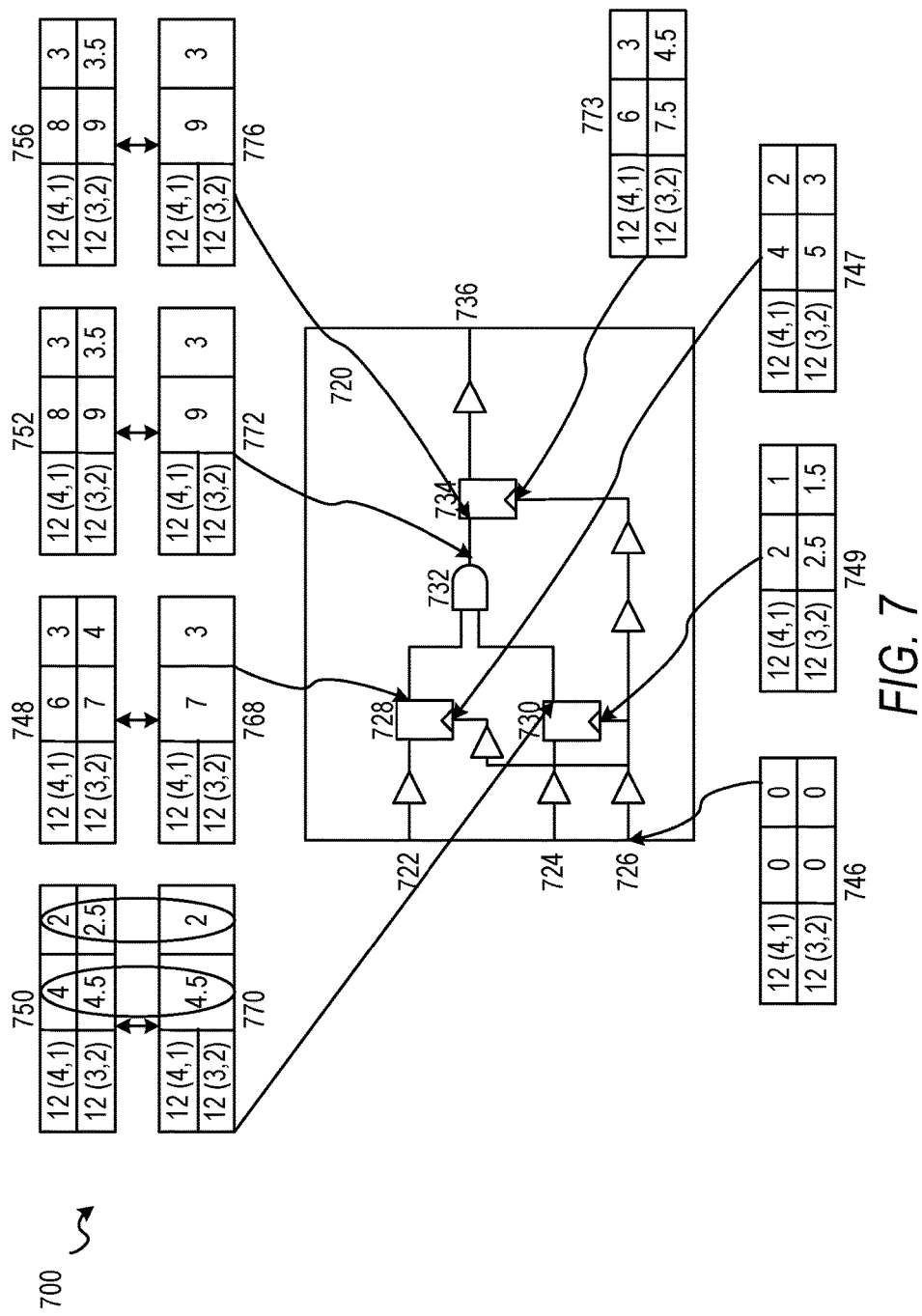
FIG. 7 illustrates aspects of timing and MMMC design for a multi-instance block, in accordance with some embodiments.

FIG. 7 illustrates aspects of timing and MMMC design for a multi-instance block, in accordance with some embodiments. FIG. 7 illustrates an embodiment of such a merge process for a block 720 associated with two instances. Block 720 has inputs 722 and 724, clock input 726, output 736, and circuit elements 728, 730, 732, and 734. Progression points 746, 747, 748, 749, 750, 752, 753, and 756 are shown with phase data in the format of data 600 from FIG. 6, but with additional timing information added to the identifier of the first column 660. This phase data is generated from timing contexts. For example, in some embodiments, after loading a block netlist, a block level SDC and SPEF file, a timing context for all instances of a multi-instance block is loaded on an EDA computing device. For each clock input port, timing context clock constraints are processed and a "phase" is created for each clock of each instance. Clock latencies at the port are not added to the arrival time of the "phase" and instead a tag containing port latencies of all the instances is added to the "phase". Clock "phases" are propagated forward from all clock input ports to register clock pins and output ports. The propagation is calculated based on the elements of the block, and the timing context (e.g. calculated context information) for a particular instance.

For example, in FIG. 7, a first instance has a late input clock latency of 4 and an early input clock latency of 1, as illustrated by the tag information for instance i1. The second instance i2 has an early input clock latency of 2 and a late input clock latency of 3. Similar to the context data above, this may vary for an individual instance under different MMMC views. The phase values at progression point 746 all start at 0. The phases then propagate to different values, and diverge for different instances, as the clock phase is calculated for progression points 747, 749, and 753 on the clock path beginning at progression point 746. Similar phase values are calculated for progression points 750, 748, 752, and 756 in the data paths.

As described above, the phase values at individual progression points are compared against a threshold. If the phase values for different instances are within the threshold difference, the values are merged. In the embodiments of FIG. 7, the threshold is greater than 1, and since the difference between the phase values at all data progression points is less than 1, these values are merged into merged data 770 for progression point 750, merged data 768 for progression point 748, merged data 772 for progression point 752, and merged data 776 for progression point 756. For each merged data, the higher value for the late arrival time is used, and the lower value for the early arrival time is used, as these are the worst-case values for this data element (e.g. the data closer to an associated design value, which is a lower value for early arrival, and a higher value for late arrival.). Thus, for propagation point 750, the early arrival phase for i1 with a value of 2 and the early arrival phase for i2 with a value of 2.5 are merged to the value 2. Similarly, for propagation point 756, early arrival values of 3 and 3.5 are merged to 3. By contrast, late arrival values for propagation point 750 of 4 and 4.5 are merged to the value of 4.5, which is the later (e.g. worse) value for late arrival. Merged data 776 and unmerged clock data 773, for example, may then be used for timing analysis by calculating slack values for circuit element 734, and comparing the calculated values to design limitations.

While merged data for two instances is shown, as discussed above, many different instances and instance/ MMMC view combinations may be present in different embodiments, such that phase data for a single propagation point for a block in a circuit design may have many rows. In some embodiments, a worst value for each column may be identified, with all rows having a value within that column that is within the threshold range being merged. The worst value not merged is then compared with any remaining values in the column that were not merged to generate a second merged entry, and so on until each individual value has been merged or identified as not being within range of an unmerged value. In some embodiments, other methods of merging groups of values may be used. In some embodiments, rather than a threshold for phase values being within a range, merger may occur to generate a set number of merged groups. For example, in an embodiment with 25 instances, the 25 values for a progression point are merged to generate 5 different merged groups. These may be equal groups, or groups merged based on any clustering analysis. In some embodiments, the merger is based only on the data for an individual progression point. In other embodiments, different progression points in the same data or clock path are considered.

In some embodiments, only data progression points are merged. In some embodiments, only clock progression points are merged. In some embodiments, data at all progression points is analyzed to determine if it is appropriate for merging (e.g. based on thresholds or other merging rules.) In some embodiments, a number of merged instances/ MMMC views is dynamically adjusted in response to a design failure. For example, if a timing failure is identified in a path or at a progression point that has been merged, a merger threshold may be tightened, or a number of merged values lowered automatically, and the analysis recalculated with the new merged data. Such dynamic adjustments enable greater accuracy without immediately calculating each and every timing value. In some embodiments, if a timing value fails when merged timing data is used, a related timing analysis is performed with no merged data.

In some embodiments, data "phases" are propagated for each instance of multi-instance blocks for all interface paths (e.g. from inputs/to outputs) and "phases" are merged across all instances for all internal paths (e.g. register to register) where possible. Output port information is propagated backward from each output port and stored on a progression point as "downstream output expected". Similarly, input port information is propagated forward from each input port and stored on a pin as "upstream input expected". For each block data input port, timing context constraints are processed and a "phase" is created for each instance of multi-instance block. "Phases" are propagated forward from each block data input port to register inputs/output ports. At a register clock pin, propagated latencies (e.g. without port latencies) of all "phases" for each instance/MMMC view are compared and if they are within a user specified threshold, only the "phase" corresponding to the worst propagated latency instance is propagated to register output. Other phases are dropped. If the register output is marked as "downstream output expected", all instance "phases" are propagated to the register output. "Phases" are then propagated forward from all register outputs.

Whether data is merged or not, this information is used to calculate expected worst case timing values for identified points. These timing values are then compared with design rules to determine timing violations. If timing violations are identified where estimates (e.g. merged values) are used, then calculations may be performed with greater accuracy (e.g. closer estimates, lower merger thresholds, or no merging.)

Figure 8:
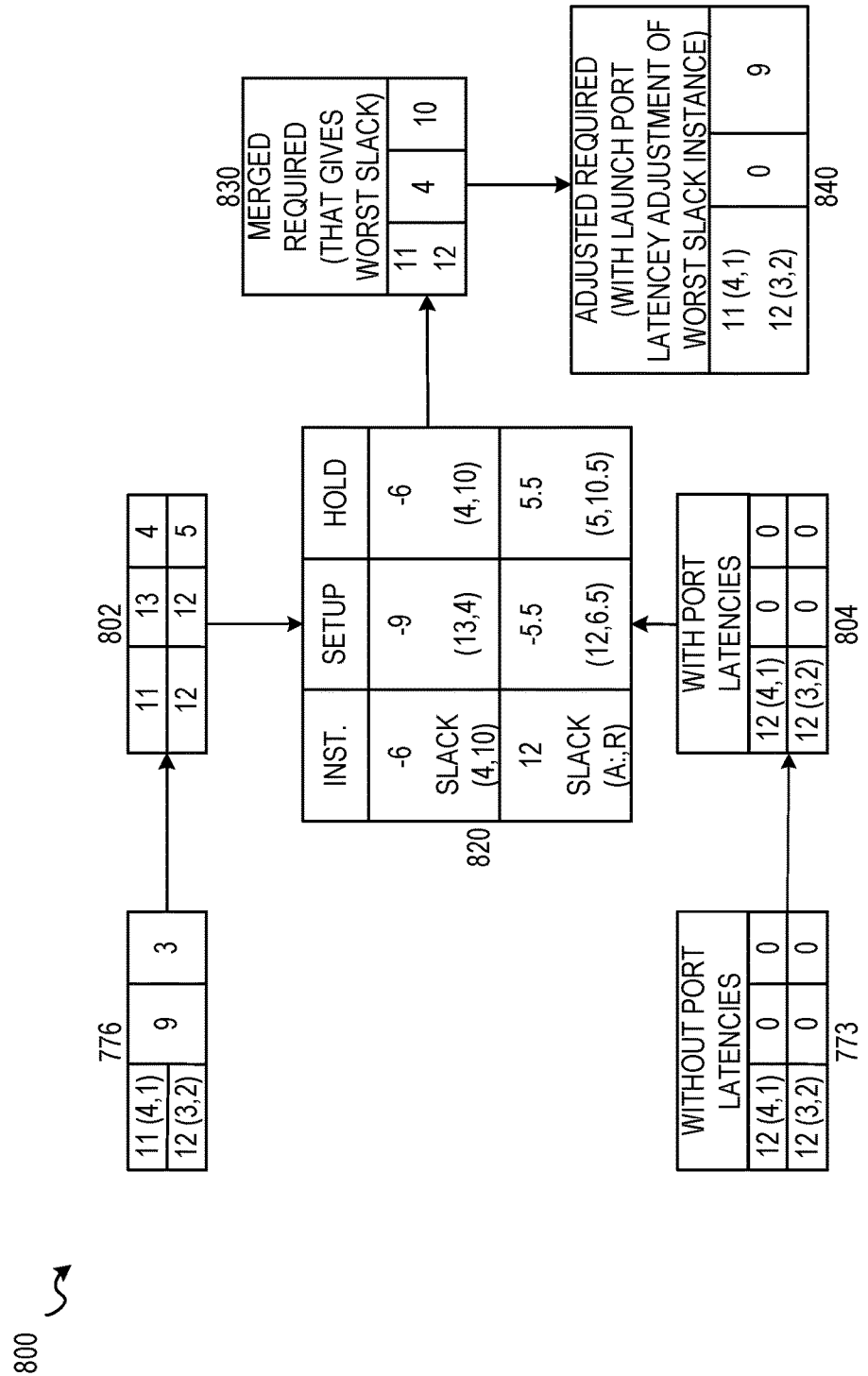
FIG. 8 illustrates aspects of timing and MMMC design for a multi-instance block, in accordance with some embodiments.

FIG. 8 illustrates aspects of timing and MMMC design for a multi-instance block, in accordance with some embodiments. In some embodiments, the timing data described in FIG. 7 is used for timing analysis as described with respect to FIG. 8, with merged data 776 from progression point 756 used with clock phase data from progression point 753 used to calculate slack values for circuit element 734 as part of timing analysis 800. In FIG. 8, the merged data 776 associated with progression point 756 at the data input to circuit element 734 and unmerged clock data 773 from progression point 753 and the clock input to circuit element 734 are used. The input timing tag discussed above for each instance (e.g. (4,1) for the first instance and (3,2) for the second instance) is used with merged data 776 and unmerged clock data 773 to generate timing data 802 and clock timing data 804 Timing data 802 is an estimate of the timing data, including the input phase, for progression point 756. Clock timing data 804 is the overall timing data for the circuit design, using the phase information for the instance plus the input delays from the overall circuit design at the input to the instance. Timing data 802 and clock timing data 804 is then used to calculate the slack for circuit element 734. In other words, at circuit element 734, required time is calculated for each instance using capture propagated latency, capture port latency and cppr. Slack is then calculated using required time, data arrival time and launch port latency. Merged required time is the required time of the instance with worst slack. This required time is then adjusted by the launch latency of the instance with the worst slack as shown by data 830. Finally, arrival and required times which are independent of port latencies are used to generate data 840. This ensures that slack calculation at any intermediate pin upstream from the end point is correct. Otherwise, it would have required the worst slack instance information to be propagated backward with required time from the end point. In the embodiment of FIG. 8, Since the worst slack comes from instance i1, as shown by the data values, the required time is adjusted with port latencies of instance it (e.g. (4,1)).

Figure 9:
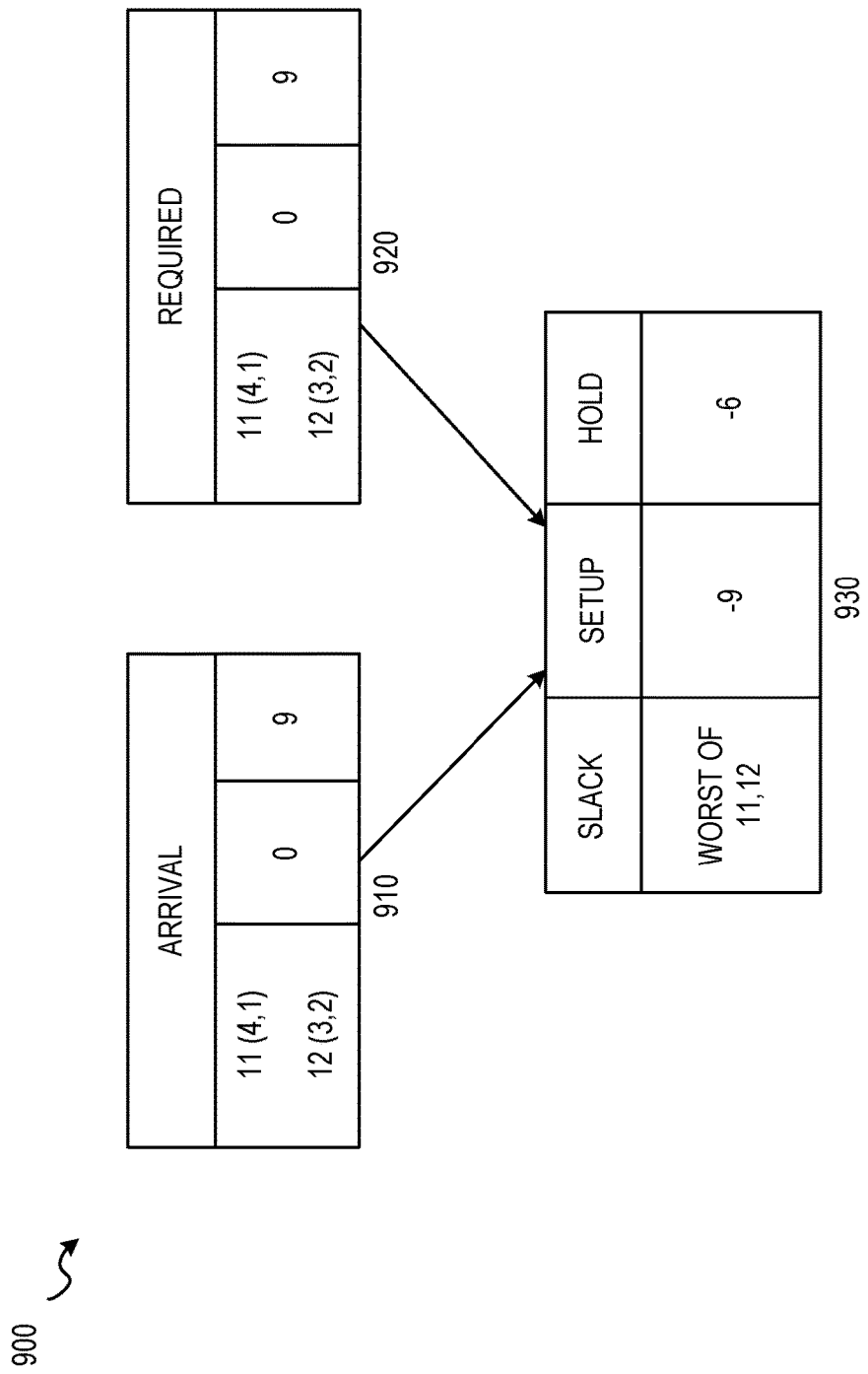
FIG. 9 illustrates aspects of timing and MMMC design for a multi-instance block, in accordance with some embodiments.

FIG. 9 illustrates aspects of timing and MMMC design for a multi-instance block, in accordance with some embodiments. For any given progression point, a required value (e.g. a design selection) may be compared with merged timing data to determine an intermediate pin slack, as shown by FIG. 9. In such embodiments, required values from a design are compared with the worst-case data from the merged values to determine slack. As shown by FIG. 9, the late arrival value of data 910 is subtracted from the corresponding required value of data 920 to determine the setup value of data 930 (e.g. 0−9=−9) and the late arrival value of data 910 is subtracted from the required value of data 920 to arrive at the hold value of data 930 (e.g. 3−9=−6). Timing analysis using hybrid merged data may thus be used for timing analysis that is performed accurately using launch and capture port latencies for all instances.

In some embodiments, various modes may be used with different levels of merged data for different calculation efficiencies. For some embodiments, in one mode only one set of delays are used for internal paths (e.g. register to register or data progression points only). In such embodiments, delays are calculated and propagated for each instance of a multi-instance block for interface paths. For timing analysis without signal integrity, delays of only one instance of a multi-instance block are calculated and used on internal paths. This mode is used for early timing closure and initial physical optimization steps, making the solution extremely efficient. For timing analysis with signal integrity, delays are calculated for all instances of a multi-instance block with worst-case values. A timing window of a particular instance is calculated by adding port latency of the instance to the "phase" arrival time. In some such embodiments, this mode is used later in the physical optimization design flow.

In some embodiments, another mode allows full accuracy in addition to other modes with hybrid merger efficiencies. In a full accuracy mode, delay calculations are performed and stored separately for each instance of a multi-instance block on internal paths as well. Similarly, data "phases" will also be propagated separately on all internal paths. This mode may be used for final timing closure, if full accuracy is desired.

Figure 10:
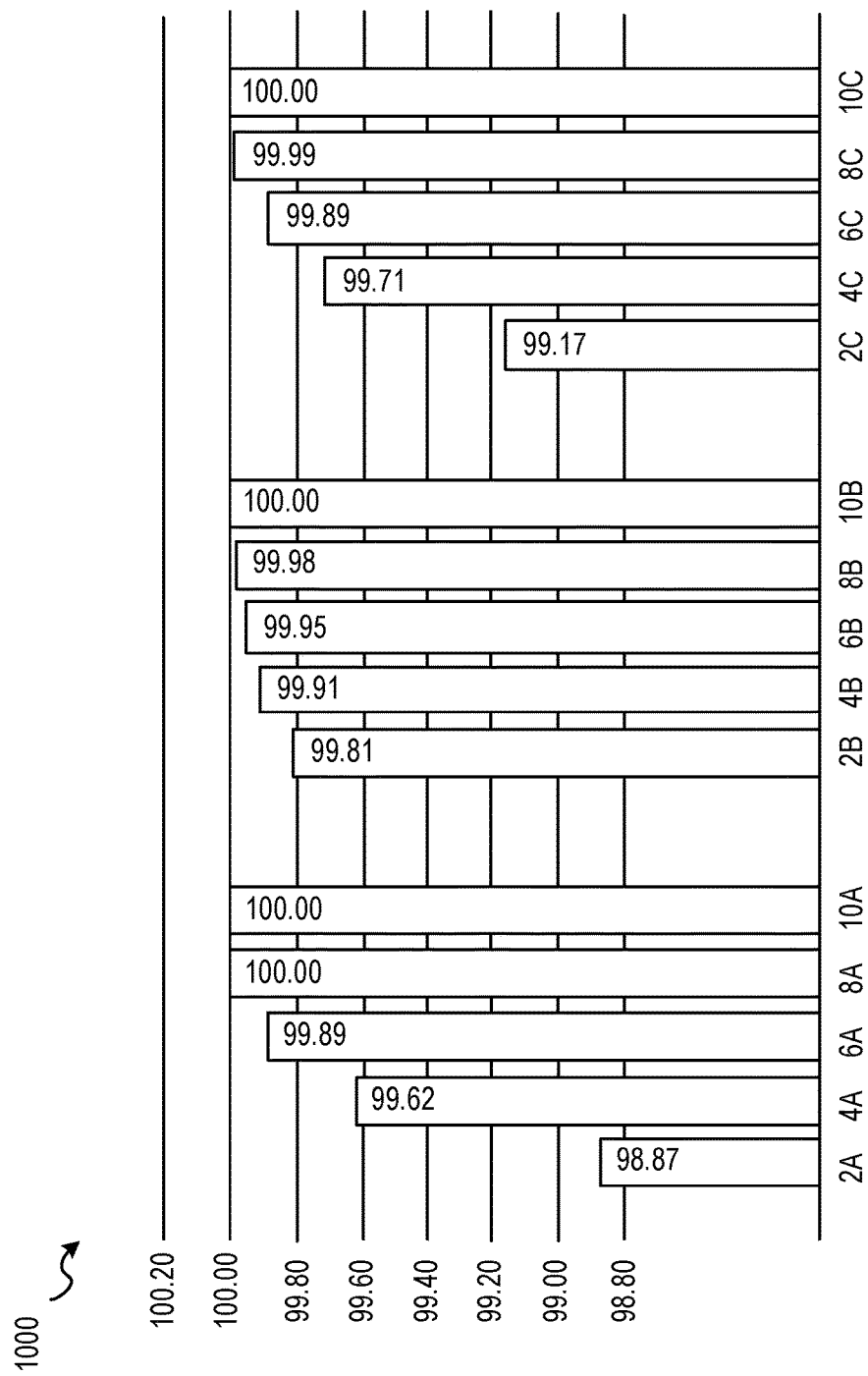
FIG. 10 illustrates aspects of hierarchical timing analysis for multi-instance blocks, according to some example embodiments.

FIG. 10 illustrates aspects of hierarchical timing analysis for multi-instance blocks, according to some example embodiments. FIG. 10 shows example details of implementations for circuit designs having different numbers of instances. In particular, FIG. 10 shows delay comparisons of timing arcs across multiple instances of a multi-instance block. As is apparent from the examples, some arcs have small delay differences, with bigger differences in the example implementations from interface paths and clock network issues due to SI effects from aggressors outside the block. Without SI, delays should exactly match, providing benefits during early iterations of a timing closure flow. Data 2A through 10A is for a design having 4 block instances. Data 2B through 10B is for a circuit design having 48 block instances. Data 2C through 10C is for a circuit design with 2 instances. Data 2 is for a % of arcs with 0 picosecond (ps) differences, Data 4 is for arcs with less than 5 ps differences. Data 6 is for arcs with less than 10 ps difference. Data 8 is for arcs with less than 25 ps differences. Data 10 is for arcs with differences greater than or equal to 25 ps.

Figure 11:
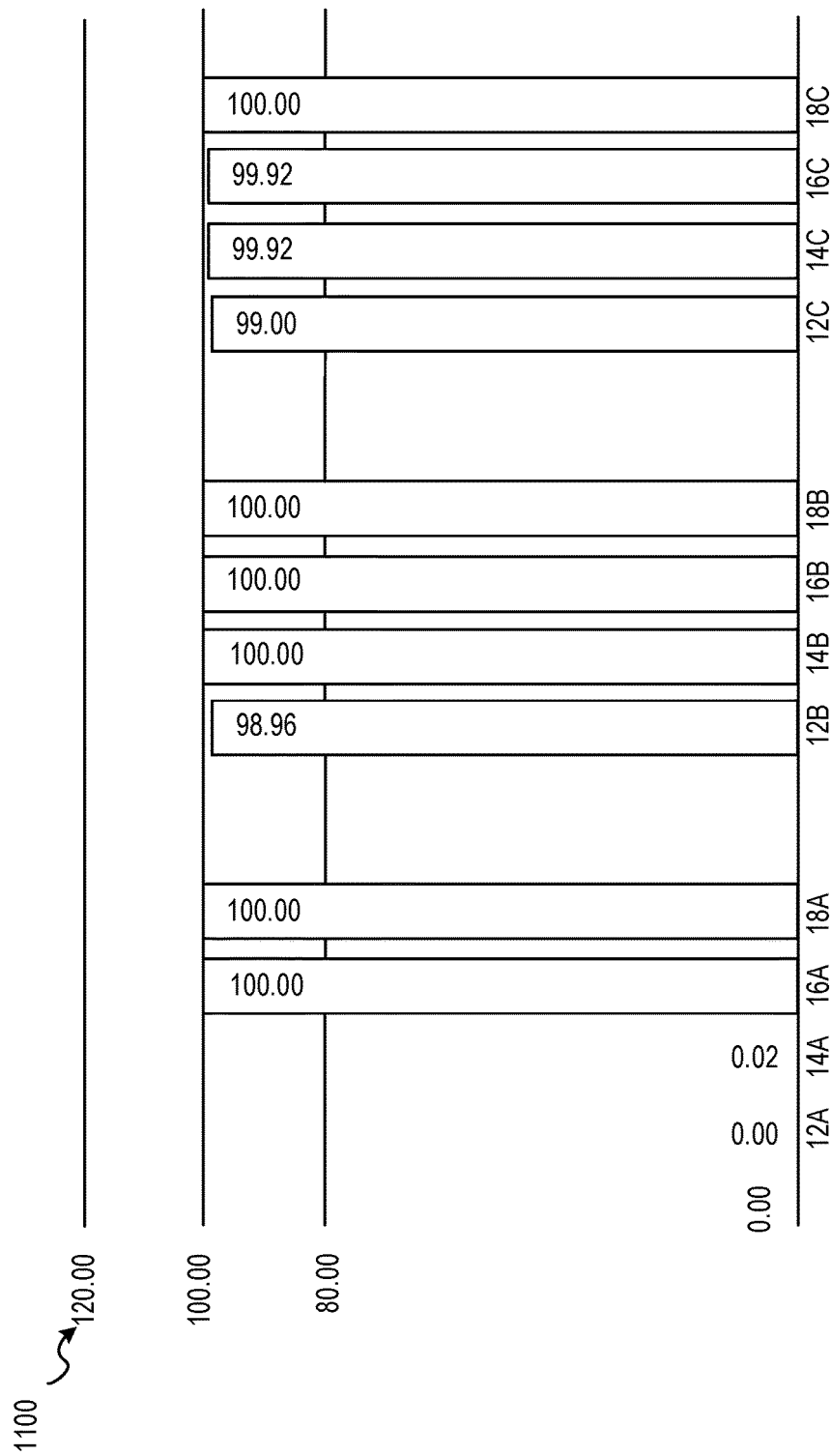
FIG. 11 illustrates aspects of hierarchical timing analysis for multi-instance blocks, according to some example embodiments.

FIG. 11 illustrates aspects of hierarchical timing analysis for multi-instance blocks, according to some example embodiments. FIG. 11 shows propagated latency without port latencies compared at register clock pins across multiple instances for expected circuit designs. As a result of expected very small percentage differences in latencies, merger for expected circuit designs with thresholds less than a few percent would result in merging timing data at most register outputs. Data 12A through 18A is for a design with four block instances. Data 12B through 18B is for expected designs with 48 block instances. Data 12C through 18C is for expected designs with two block instances. Data 12A through 12C is for register to clock pin implementations with 0 ps differences. Data 14A through 14C is for register to clock pin implementations with less than 5 ps differences. Data 16A through 16C is for register to clock pin implementations with 5 to 10 ps differences. Data 18A through 18C is for register to clock pin implementations with 10 to 50 ps differences.

Figure 12:
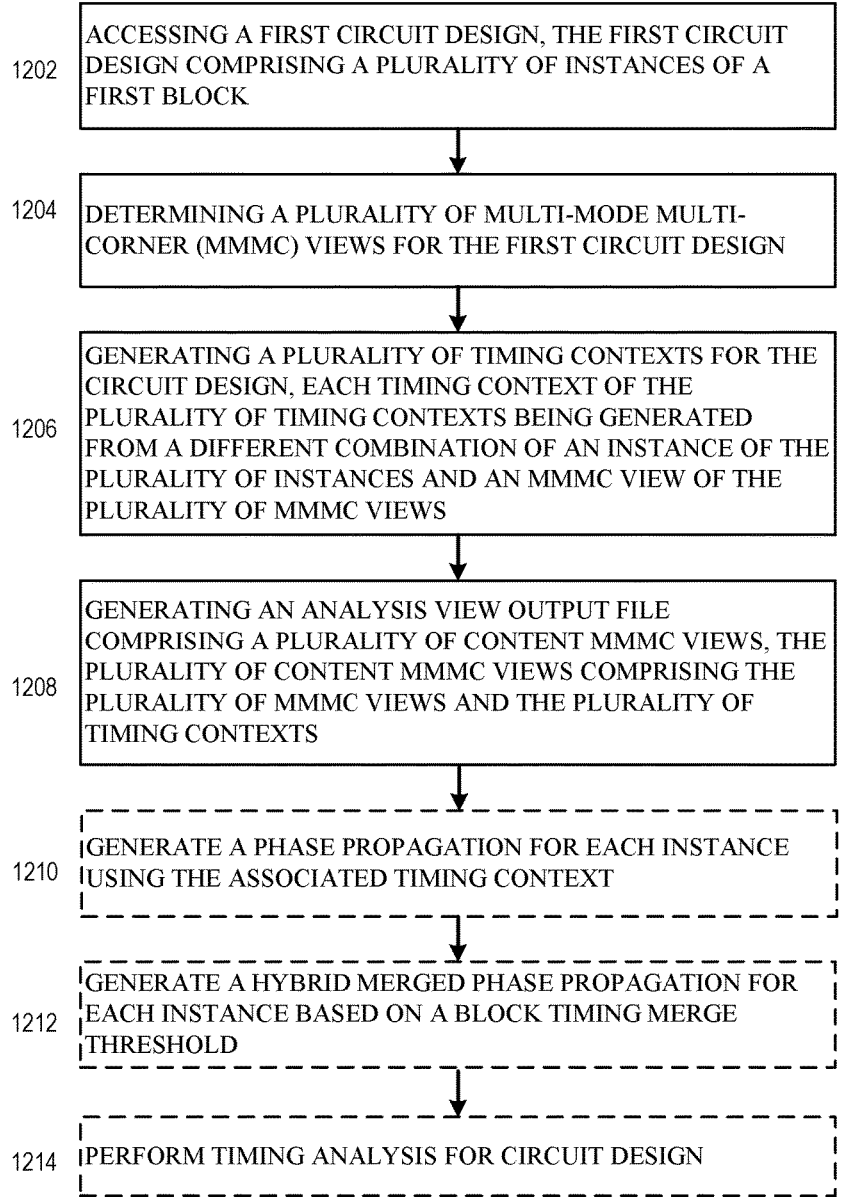
FIG. 12 is an example method of hierarchical timing analysis for multi-instance blocks, according to some example embodiments.

FIG. 12 is an example method of hierarchical timing analysis for multi-instance blocks, according to some example embodiments. In some embodiments, method 1200 is a method performed by an EDA computing device to generate design files for a circuit design. In some embodiments, method 1200 is represented by instructions stored in a memory of an EDA computing device or in a non-transitory computer readable medium, where the instructions cause the EDA computing device to perform method 1200 when executed by one or more processors.

Method 1200 begins with accessing a first circuit design (e.g. one or more design files) in operation 1202, the first circuit design comprising a plurality of instances of a first block. As described above, the circuit design accessed may be represented by various design, library, SDC, and other files. Then in operation 1204, a plurality of multi-mode multi-corner (MMMC) views for the first circuit design are accessed. The specific MMMC views may be determined by design details of the circuit design as accessed by an EDA computing device, or may be based on operator inputs. The MMMC views, in various embodiments, include any combination of operating conditions and operating modes for the circuit design, and related impacts on elements of the circuit design. The EDA computing device then generates a plurality of timing contexts for the circuit design in operation 1206, with each timing context of the plurality of timing contexts being generated from a different combination of an instance of the plurality of instances and an MMMC view of the plurality of MMMC views. In various embodiments, the timing contexts comprise phase delay information associated with the particular MMMC view as it influences an instance of a block within the circuit design. This includes impacts on resistance and capacitance values of materials, packaging, and any other such characteristics of any element of a circuit design. Operation 1208 then involves generating an analysis view output file comprising a plurality of content MMMC views, the plurality of content MMMC views comprising the plurality of MMMC views and the plurality of timing contexts. As such, in some embodiments of operation 1208, an analysis view file having data associated uniquely with each combination of an instance and MMMC view is created. In some embodiments, such information may be represented in a table form, with a column or row for each instance/MMMC view combination.

After the analysis view output file is generated in operation 1208, this file or associated data may be used by an EDA computing device in various ways. In operation 1210, a phase propagation for each instance of a block or each instance/MMMC view may be generated using the timing context associated with each instance or each instance/MMMC view. In operation 1212, a hybrid merged phase propagation table or data file may be generated for each instance, with the merging of phase and related timing data based on a merge threshold as described above. In operation 1214, various timing analysis calculations and reports are generated using the timing contexts, including slack calculations, and timing closure calculation and reporting. Additionally, various embodiments of method 1200 may incorporate some or all of various other embodiments described herein, in combination with any intervening or repeated operations.

For example, in some embodiments, method 1200 is followed by performance of a timing analysis with the analysis view file and generation of timing reports. This includes embodiments where timing contexts include input and output boundary condition information for circuit elements of multi-instance block(s) in a circuit design. In some such embodiments, the boundary condition information is based on various combinations of clock arrival times, phase tags representing upstream path constraints, driver information, data required times, downstream path constraints, external parasitics, and external timing window aggressors. Any such embodiments may then perform timing analysis operations and generate reports using such boundary condition information. In some embodiments, following adjustment of a circuit design based on the results of timing reports and comparison of the original circuit design against timing requirements, an updated circuit design is generated. In various embodiments, various devices, systems, and methods are used to fabricate devices based on the updated circuit design. In some embodiments, this includes generation of masks, and the use of machinery for circuit fabrication. In various implementations, files generated by embodiments described herein are used to create photolithographic masks for lithography operations used to generate circuits according to a circuit design, where a pattern defined by the masks is used in applying thin uniform layer of viscous liquid (photo-resist) on the wafer surface. The photo-resist is hardened by baking and then selectively removed by projection of light through a reticle containing mask information. In some implementations, the files are further used for etching patterning, where unwanted material from the surface of the wafer is removed according to details described in the design files, where a pattern of the photo-resist is transferred to the wafer by means of etching agents. In some embodiments, aspects of design files generated according to the operations described herein are used for deposition operations, where films of the various materials are applied on the wafer. This may involve physical vapor deposition (PVD), chemical vapor deposition (CVD) or any such similar processes. Some embodiments may use files generated according to operations described herein for chemical mechanical polishing, where a chemical slurry with etchant agents is used to planarize to the wafer surface; for oxidation where dry oxidation or wet oxidation molecules convert silicon layers on top of the wafer to silicon dioxide; for ion implantation where dopant impurities are introduce into a semiconductor using a patterned electrical field; or for diffusion where bombardment-induced lattice defects are annealed. Thus, in various embodiments, systems and operations include not only computing devices for generating updated circuit design files, but hardware systems for fabricating mask, controlling IC fabrication hardware, and the hardware and operations for fabricating a circuit from a circuit design generated using hierarchical timing analysis as described herein.

Figure 13:
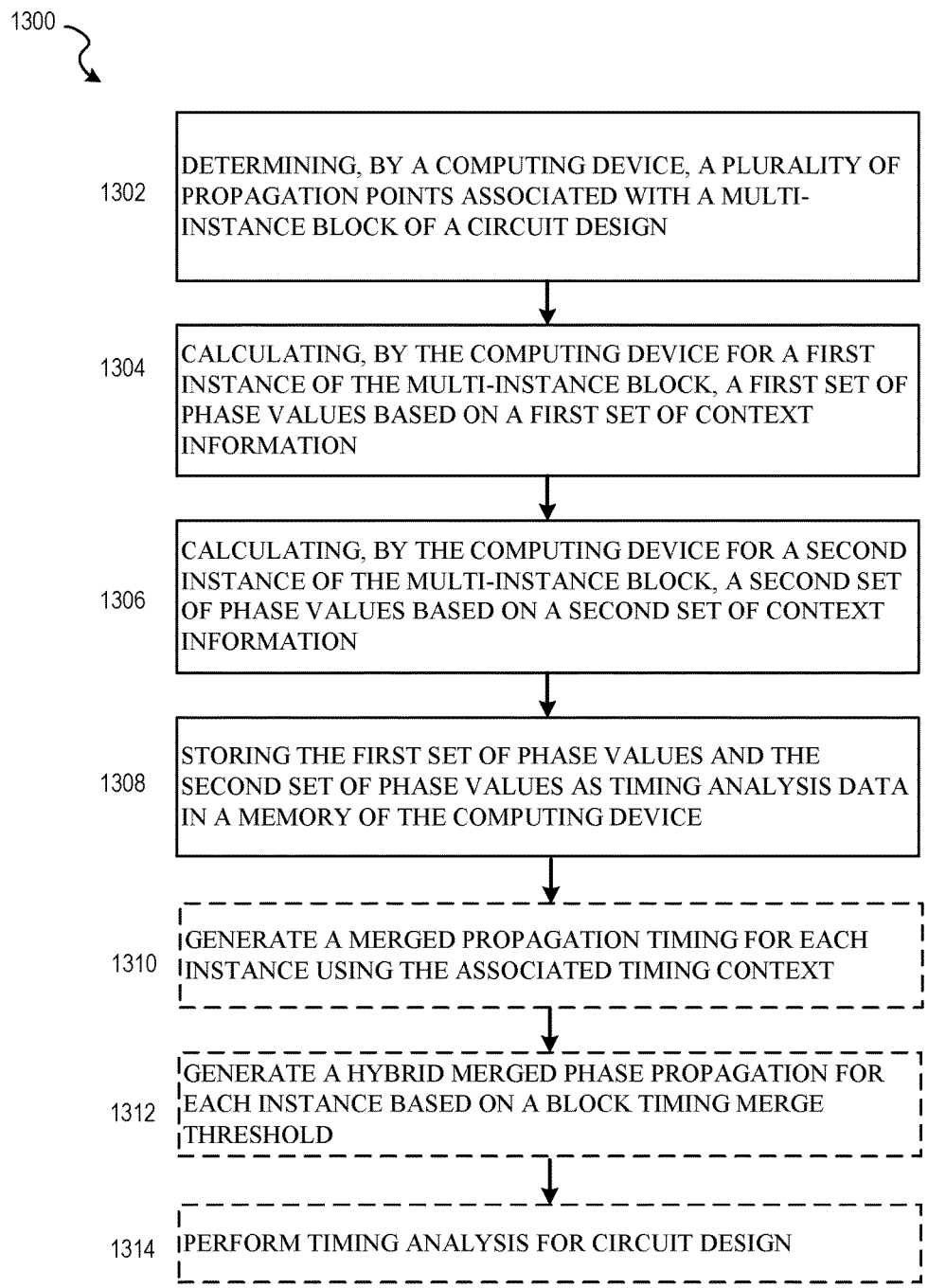
FIG. 13 is an example method of hierarchical timing analysis for multi-instance blocks, in accordance with some example embodiments.

FIG. 13 is an example method of hierarchical timing analysis for multi-instance blocks with view merging, in accordance with some example embodiments. As above for method 1200, method 1300 may be implemented in a variety of different ways. In some embodiments, methods 1200 and 1300 are performed together in various patterns which may include repetition of some or all elements and various orderings of the described operations. In some embodiments, any method described herein is implemented as a non-transitory computer readable medium comprising instructions that, when executed by one or more processors of an electronic design automation (EDA) computing device, cause the device to perform operations of the embodiment. Some embodiments are implemented as a system made up of one or more processors configured to execute instructions to perform operations in analyzing the integrated circuit design and a non-transitory processor readable medium to store the instructions that when executed, cause the one or more processors to perform operations of the embodiment.

Method 1300 begins with operation 1302 determining, by an electronic design automation (EDA) computing device, a plurality of propagation points associated with a multi-instance block of the circuit design. These may be points in at circuit element registers, circuit element inputs or outputs, or any other point within a block design having a variety of internal circuit elements.

Operation 1304 then involves calculating, by the EDA computing device for a first instance of the multi-instance block, a first set of phase values comprising a first corresponding phase value for each propagation point of the plurality of propagation points. In various embodiments, the first set of phase values are based on a set of circuit elements of the multi-instance blocks and a first set of context information, the first set of context information based, at least in part, on first one or more elements of the circuit design outside the first instance. In other words, various aspects of a circuit design outside an instance may influence the timing of signals within an instance. Similarly, MMMC conditions, as described herein, may impact timing and operation of an instance of a block within a circuit design.

In operation 1306, the EDA computing device calculates, for a second instance of the multi-instance block, a second set of phase values comprising a second corresponding phase value for each propagation point of the plurality of propagation points. These are similar to the related parts of the first instance above, where the second set of phase values are based on the set of circuit elements of the multi-instance blocks and a second set of context information, the second set of context information is based, at least in part, on one or more elements of the circuit design outside the second instance. In operation 1308, the propagated phase information is stored as the first set of phase values and the second set of phase values representing timing analysis data in a memory of the EDA computing device.

This timing analysis data is then used to generate merged propagation timing for each instance in operation 1310. In some embodiments, this merged propagation timing is for a data path and not a clock path. In some additional embodiments, hybrid merged phase propagation may be calculated based on merge thresholds in operation 1312. In operation 1314, the phase values and any related data are used for timing analysis including calculation of slack values based on phase information and/or merged phase information to perform efficient and accurate timing analysis.

In some embodiments, slack calculations described above, or any other such timing analysis calculation is performed. In some embodiments, the operations are performed using boundary conditions for elements of the blocks, with the boundary condition information based on clock arrival times, phase tags representing upstream path constraints, driver information, data required times, downstream path constraints, external parasitics, and external timing window aggressors as described above.

In some embodiments, hybrid-merge operations are used to optimize timing analysis. For example, in some embodiments a plurality of MMMC views for a first circuit design are used in the phase or hybrid-hierarchical timing analysis. In some embodiments, propagation points are associated with inputs and outputs of circuit elements, and slack calculations or various other timing calculations are performed based on this association. For hybrid-calculations, in some embodiments a block timing merge threshold his used. Such a block timing merge threshold sets how close phase or other timing values described above may be before they are merged in a hybrid analysis. In some such embodiments, the block timing merge threshold is compared with a difference between a first phase value of the first set of phase values and a second phase value of the second set of phase values, wherein the first phase value and the second phase value are both associated with a first propagation point of the plurality of propagation points. If the difference is less than the block timing merge threshold, subsequent operations involve merging the first phase value and the second phase value to generate a merged phase value associated with the first propagation point. If the difference is greater than the block timing merge threshold, operations proceed by maintaining separate phase values for the first instance and the second instance of the first block associated with the first propagation point. Various merged or separate calculations are then performed based on whether the blocks were merged. In various embodiments, such mergers may be performed both for different blocks in the same MMMC view, and for different blocks or the same block in different MMMC views. In some embodiments, after slack values are calculated, latency values or latency tags in a data set for the circuit design are used to calculate required times for each propagation point. In such embodiments, common clock path pessimism removal may be used to determine the required time. Such operations are, in some embodiments, performed for multiple different multi-instance blocks of a single design, as well as over multiple MMMC views. In some embodiments, hybrid analysis with merging and full timing analysis without merging are run on the same circuit design based on user selections or error thresholds. For example, in some embodiments, if a hybrid analysis using a merger identifies a timing result that is close to but failing a timing requirement of the system design, a full analysis is run to determine if the result of the hybrid merger generating a result that is worse than the full result, since the merging process selects for a worst case.

Just as described above, following closure of timing (e.g. a determination that the current version of a circuit design meets all timing requirements specified by the designer) some embodiments include systems, devices, and operations for fabricating a circuit in addition to the generation of design files for use by such systems, devices, and operations.

Figure 14:
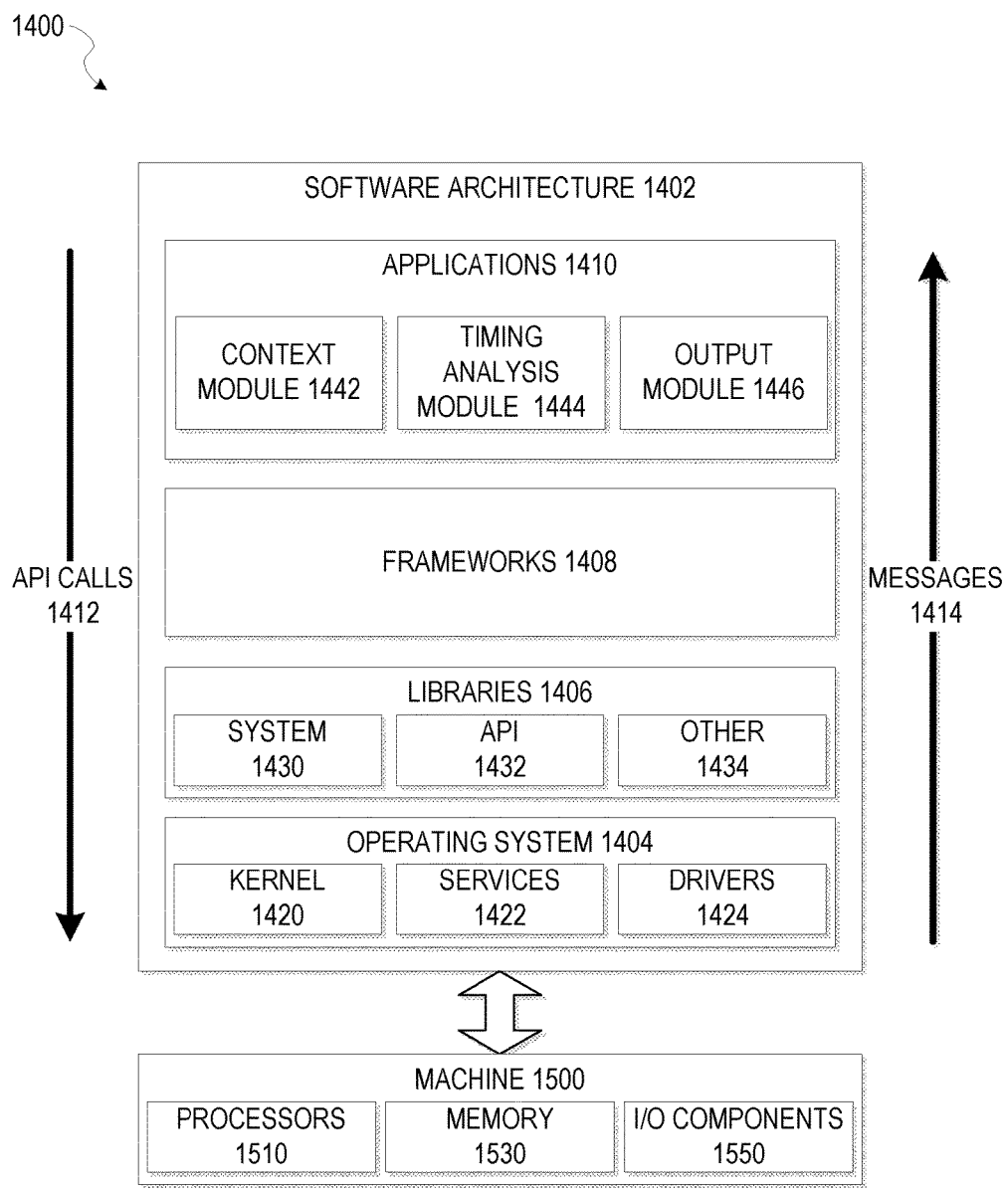
FIG. 14 is a block diagram illustrating an example of a software architecture that may be operating on an electronic design automation (EDA) computer and used with methods for meeting concurrent timing constraints for multi-instantiated block optimization, according to some example embodiments.

FIG. 14 is a block diagram 1400 illustrating an example of a software architecture 1402 that may be operating on an electronic design automation (EDA) computer and used with methods for meeting concurrent timing constraints for multi-instantiated block optimization, according to some example embodiments. FIG. 14 shows is a block diagram illustrating a software architecture 1402, which can be used as an electronic design automation computing device to implement any of the methods described above. Aspects of software architecture 1402 may, in various embodiments, be used to store circuit designs and execute timing analysis or optimization in an EDA environment to generate circuit designs, with physical devices generated using these circuit designs.

FIG. 14 is merely a non-limiting example of a software architecture 1402, and it will be appreciated that many other architectures can be implemented to facilitate the functionality described herein. In various embodiments, the software architecture 1402 is implemented by hardware such as machine 1500 of FIG. 15 that includes processors 1510, memory 1530, and I/O components 1550. In this example, the software architecture 1402 can be conceptualized as a stack of layers where each layer may provide a particular functionality. For example, the software architecture 1402 includes layers such as an operating system 1404, libraries 1406, frameworks 1408, and applications 1410. Operationally, the applications 1410 invoke application programming interface (API) calls 1412 through the software stack and receive messages 1414 in response to the API calls 1412, consistent with some embodiments. In various embodiments, any client device, server computer of a server system, or any other device described herein may operate using elements of software architecture 1402. An EDA computing device described herein may additionally be implemented using aspects of the software architecture 1402, with the architecture 1402 adapted for operating to perform multi-instance timing analysis in any manner described herein.

In one embodiment, an EDA application of applications 1410 performs multi-instance timing optimization according to embodiments described herein using various modules within software architecture 1402. For example, in one embodiment, an electric design automation (EDA) computing device similar to machine 1500 includes memory 1530 and one or more processors 1510. The processors 1510 implement context module 1442 to generate timing contexts from input data for an integrated circuit design. The processors 1530 also implement timing analysis module 1444 to process design input files to generate phase and timing data for instances and MMMC views using context data from context module 1442, and to perform timing analysis with output timing reports.

Processor implemented output module 1446 may then be used to update a display of I/O components 1550 of the EDA computing device with data associated with the set of timing analysis results.

In various other embodiments, rather than being implemented as modules of one or more applications 1410, some or all of modules 1442, 1444, and 1446 may be implemented using elements of libraries 1406 or operating system 1404.

In various implementations, the operating system 1404 manages hardware resources and provides common services. The operating system 1404 includes, for example, a kernel 1420, services 1422, and drivers 1424. The kernel 1420 acts as an abstraction layer between the hardware and the other software layers, consistent with some embodiments. For example, the kernel 1420 provides memory management, processor management (e.g., scheduling), component management, networking, and security settings, among other functionality. The services 1422 can provide other common services for the other software layers. The drivers 1424 are responsible for controlling or interfacing with the underlying hardware, according to some embodiments. For instance, the drivers 1424 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1406 provide a low-level common infrastructure utilized by the applications 1410. The libraries 1406 can include system libraries 1430 such as libraries of multi-instance blocks for use in an EDA environment or other libraries that can provide functions such as memory allocation functions, string manipulation functions, mathematic functions, and the like. In addition, the libraries 1406 can include API libraries 1432 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 1406 may also include other libraries 1434.

The software frameworks 1408 provide a high-level common infrastructure that can be utilized by the applications 1410, according to some embodiments. For example, the software frameworks 1408 provide various graphic user interface (GUI) functions, high-level resource management, high-level location services, and so forth. The software frameworks 1408 can provide a broad spectrum of other APIs that can be utilized by the applications 1410, some of which may be specific to a particular operating system 1404 or platform. In various embodiments, the systems, methods, devices, and instructions described herein may use various files, macros, libraries, and other elements of an EDA design environment to implement analysis described herein. This includes analysis of input design files for an integrated circuit design, along with any element of hierarchical analysis that may be used as part of or along with the embodiments described herein. While netlist files, library files, SDC files and view definition files are examples that may operate within a software architecture 1402, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1500 including processors 1510), with these operations being accessible via a network (e.g., the Internet) and via one or more appropriate interfaces (e.g., an application program interface (API)). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine 1500, but deployed across a number of machines 1500. In some example embodiments, the processors 1510 or processor-implemented modules are located in a single geographic location (e.g., within a home environment, an office environment, or a server farm). In other example embodiments, the processors or processor-implemented modules are distributed across a number of geographic locations.

Figure 15:
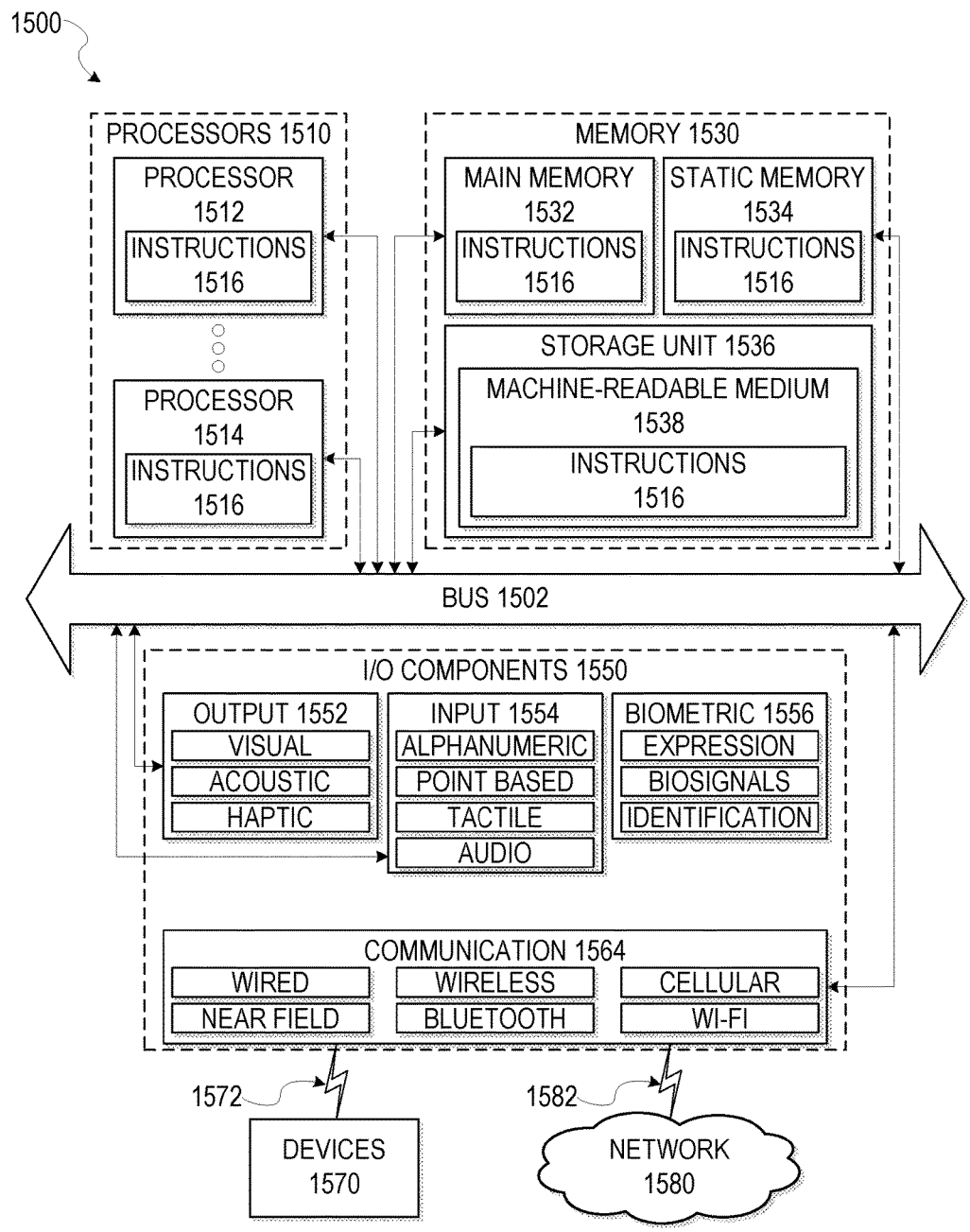
FIG. 15 is a diagrammatic representation of a machine in the form of a computer system within which a set of instructions may be executed for causing the machine to perform any one or more of the methodologies discussed herein, according to an example embodiment.

FIG. 15 is a diagrammatic representation of the machine 1500 in the form of a computer system within which a set of instructions may be executed for causing the machine 1500 to perform any one or more of the methodologies discussed herein, according to an example embodiment. FIG. 15 shows components of the machine 1500, which is, according to some embodiments, able to read instructions from a machine-readable medium (e.g., a machine-readable storage medium) and perform any one or more of the methodologies discussed herein. Specifically, FIG. 15 shows a diagrammatic representation of the machine 1500 in the example form of a computer system, within which instructions 1516 (e.g., software, a program, an application, an applet, an app, or other executable code) for causing the machine 1500 to perform any one or more of the methodologies discussed herein can be executed. In alternative embodiments, the machine 1500 operates as a standalone device or can be coupled (e.g., networked) to other machines. In a networked deployment, the machine 1500 may operate in the capacity of a server machine or a client machine in a server-client network environment, or as a peer machine in a peer-to-peer (or distributed) network environment. The machine 1500 can comprise, but not be limited to, a server computer, a client computer, a personal computer (PC), a tablet computer, a laptop computer, a netbook, a set-top box (STB), a personal digital assistant (PDA), a media system, a cellular telephone, a smart phone, a mobile device, or any machine capable of executing the instructions 1516, sequentially or otherwise, that specify actions to be taken by the machine 1500. Further, while only a single machine 1500 is illustrated, the term "machine" shall also be taken to include a collection of machines 1500 that individually or jointly execute the instructions 1516 to perform any one or more of the methodologies discussed herein.

In various embodiments, the machine 1500 comprises processors 1510, memory 1530, and I/O components 1550, which can be configured to communicate with each other via a bus 1502. In an example embodiment, the processors 1510 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) include, for example, a processor 1512 and a processor 1514 that may execute the instructions 1516. The term "processor" is intended to include multi-core processors 1510 that may comprise two or more independent processors 1512, 1514 (also referred to as "cores") that can execute instructions 1516 contemporaneously. Although FIG. 15 shows multiple processors 1510, the machine 1500 may include a single processor 1512 with a single core, a single processor 1512 with multiple cores (e.g., a multi-core processor 1512), multiple processors 1510 with a single core, multiple processors 1510 with multiples cores, or any combination thereof.

The memory 1530 comprises a main memory 1532, a static memory 1534, and a storage unit 1536 accessible to the processors 1510 via the bus 1502, according to some embodiments. The storage unit 1536 can include a machine-readable medium 1538 on which are stored the instructions 1516 embodying any one or more of the methodologies or functions described herein. The instructions 1516 can also reside, completely or at least partially, within the main memory 1532, within the static memory 1534, within at least one of the processors 1510 (e.g., within the processor's cache memory), or any suitable combination thereof, during execution thereof by the machine 1500. Accordingly, in various embodiments, the main memory 1532, the static memory 1534, and the processors 1510 are considered machine-readable media 1538.

As used herein, the term "memory" refers to a machine-readable medium 1538 able to store data temporarily or permanently and may be taken to include, but not be limited to, random-access memory (RAM), read-only memory (ROM), buffer memory, flash memory, and cache memory. While the machine-readable medium 1538 is shown, in an example embodiment, to be a single medium, the term "machine-readable medium" should be taken to include a single medium or multiple media (e.g., a centralized or distributed database, or associated caches and servers) able to store the instructions 1516. The term "machine-readable medium" shall also be taken to include any medium, or combination of multiple media, that is capable of storing instructions (e.g., instructions 1516) for execution by a machine (e.g., machine 1500), such that the instructions 1516, when executed by one or more processors of the machine 1500 (e.g., processors 1510), cause the machine 1500 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1550 include a wide variety of components to receive input, provide output, produce output, transmit information, exchange information, capture measurements, and so on. In general, it will be appreciated that the I/O components 1550 can include many other components that are not shown in FIG. 15. The I/O components 1550 are grouped according to functionality merely for simplifying the following discussion, and the grouping is in no way limiting. In various example embodiments, the I/O components 1550 include output components 1552 and input components 1554. The output components 1552 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1554 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow 100, or outputs for circuit fabrication. In various embodiments, outputs of a timing analysis are used to generate updates and changes to a circuit design, and after a final closure of timing with all associated timing thresholds and design requirements met, circuit design output files are used to generate masks and other physical outputs for generation of a circuit. As described herein, "requirements", "design elements", and other aspects of a circuit design refer to selectable values that are set as part of the design of a circuit. Such design requirements or elements may be adjusted by a system operator or circuit designer to suit the particular goals of a project or circuit that results from the operations described herein.

Communication can be implemented using a wide variety of technologies. The I/O components 1550 may include communication components 1564 operable to couple the machine 1500 to a network 1580 or devices 1570 via a coupling 1582 and a coupling 1572, respectively. For example, the communication components 1564 include a network interface component or another suitable device to interface with the network 1580. In further examples, communication components 1564 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1570 may be another machine or any of a wide variety of peripheral devices (e.g., a peripheral device coupled via a Universal Serial Bus (USB)).

Transmission Medium

In various example embodiments, one or more portions of the network 1580 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1580 or a portion of the network 1580 may include a wireless or cellular network, and the coupling 1582 may be a Code Division Multiple Access (CDMA) connection, a Global System for Mobile communications (GSM) connection, or another type of cellular or wireless coupling. In this example, the coupling 1582 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long Term Evolution (LTE) standard, others defined by various standard-setting organizations, other long range protocols, or other data transfer technology.

Furthermore, the machine-readable medium 1538 is non-transitory (in other words, not having any transitory signals) in that it does not embody a propagating signal. However, labeling the machine-readable medium 1538 "non-transitory" should not be construed to mean that the medium 1538 is incapable of movement; the medium 1538 should be considered as being transportable from one physical location to another. Additionally, since the machine-readable medium 1538 is tangible, the medium 1538 may be considered to be a machine-readable device.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method for hierarchical timing comprising:
accessing a memory of a computing device to obtain a first circuit design, the first circuit design comprising a plurality of instances of a first block;
determining, by one or more hardware processors of the computing device, a plurality of multi-mode multi-corner (MMMC) views for the first circuit design;
generating, by the one or more hardware processors, a plurality of timing contexts for the circuit design, each timing context of the plurality of timing contexts being generated from a different combination of an instance of the plurality of instances and an MMMC view of the plurality of MMMC views;
generating, by the one or more hardware processors, an analysis view output file comprising a plurality of content MMMC views, the plurality of content MMMC views comprising the plurality of MMMC views and the plurality of timing contexts;
determining a block timing merge threshold for the circuit design;
determining a first phase value for a first propagation point within the circuit design using a first timing context and a first MMMC view from the analysis view output file;
determining a second phase value for the first propagation point within the circuit design using a second timing context and a second MMMC view from the analysis view output file;
generating a merged phase value by comparing the block timing merge threshold with a difference between the first phase value and the second phase value; and
fabricating semiconductor devices using the circuit design with the hierarchical timing.

2. The method of claim 1, further comprising:
performing a timing analysis with the analysis view output file using each timing context of the plurality of timing contexts; and
generating a plurality of timing reports from the timing analysis using each timing context of the plurality of timing contexts.

3. The method of claim 1, wherein the plurality of timing contexts comprises input and output boundary condition information for one or more circuit elements of the multi-instance block.

4. The method of claim 3, wherein the input and output boundary condition information is based on one or more of: clock arrival times, phase tags representing upstream path constraints, driver information, data required times, downstream path constraints, external parasitics, and external timing window aggressors.

5. The method of claim 1, further comprising:
determining, by the computing device, a plurality of propagation points associated with the first block of the circuit design, wherein the plurality of propagation points comprises the first propagation point;
calculating, by the computing device for a first instance of the first block, a first set of phase values, wherein the first set of phase values comprises a first corresponding phase value for each propagation point of the plurality of propagation points, and wherein the first set of phase values are based on a first timing context for the first instance of the plurality of timing contexts;
calculating, by the computing device for a second instance of the first block, a second set of phase values comprising second corresponding phase values for each propagation point of the plurality of propagation points, wherein the second set of phase values are based on a second timing context for the second instance of the plurality of timing contexts;
generating a corresponding merged phase value for each point of the plurality of propagation points by comparing the block timing merge threshold with each difference between the first corresponding phase value and the second corresponding phase value for each propagation point; and
calculating a required time for each propagation point of the plurality of propagation points using the corresponding merged phase value for each point; and
storing the first set of phase values and the second set of phase values as timing analysis data in a memory of the computing device.

6. The method of claim 5, wherein the first propagation point of the plurality of propagation points is associated with an input for a first circuit element of the first block; and
wherein a second propagation point of the plurality of propagation points is associated with an output for the first circuit element of the first block.

7. The method of claim 5, further comprising:
calculating a first slack value for the first instance using the merged phase value; and
calculating a second slack value for the second instance using the merged phase value;
wherein generating the merged phase value further comprises selecting a later delay value from the first phase value and the second phase value.

8. The method of claim 1, further comprising:
determining, by the computing device, a plurality of propagation points associated with each block of the circuit design;
calculating, by the computing device for each instance of each block, a corresponding set of phase values based on each timing context for each instance;
for each block, merging phase values for each propagation point from each instance using a greatest delay for each propagation point to generated merged phase values; and
determining a single set of delays for each block using the merged phase values for the associated block.

9. The method of claim 8, further comprising:
receiving a user input selecting between a full accuracy timing analysis mode and an estimate timing analysis mode;
performing a first timing analysis using the set of phase values based on each timing context for each instance in the full accuracy timing analysis mode; and
performing a second timing analysis using the merged phase values in the estimate timing analysis mode.

10. The method of claim 1, further comprising:
analyzing the plurality of timing contexts to identify compatible timing contexts for a first instance of the first block; and
merging the compatible timing contexts to generate a merged timing context for the first instance of the first block.

11. A system for hierarchical timing analysis of a circuit design comprising a multi-instance block, the system comprising:
one or more processors configured to execute instructions to perform operations in analyzing the integrated circuit design; and
a non-transitory processor readable medium to store the instructions that when executed, cause the one or more processors to perform operations comprising:

accessing a first circuit design, the first circuit design comprising a plurality of instances of a first block;

determining a plurality of multi-mode multi-corner (MMMC) views for the first circuit design;

generating a plurality of timing contexts for the circuit design, each timing context of the plurality of timing contexts being generated from a different combination of an instance of the plurality of instances and an MMMC view of the plurality of MMMC views; and generating an output file comprising a plurality of content MMMC views, the plurality of content MMMC views comprising the plurality of MMMC views and the plurality of timing contexts for each instance of the circuit design;

determining a block timing merge threshold for the integrated circuit design;

determining a first phase value for a first propagation point within the integrated circuit design using a first timing context and a first MMMC view from the output file;

determining a second phase value for the first propagation point within the integrated circuit design using a second timing context and a second MMMC view from the output file;

generate a merged phase value by comparing the block timing merge threshold with a difference between the first phase value of the first set of phase values and the second phase value of the second set of phase values, wherein the first phase value and the second phase value; and calculating a required time for the first propagation point using the merged phase value; and fabricating semiconductor devices using the circuit design with the hierarchical timing.

12. The system of claim 11 wherein the non-transitory processor readable medium further stores second instructions that when executed, cause the one or more processors to perform further operations comprising:

determining a plurality of propagation points associated with the multi-instance block of the circuit design, wherein the plurality of propagation points comprises the first propagation point;

calculating, for a first instance of the multi-instance block, a first set of phase values comprising a first corresponding phase value for each propagation point of the plurality of propagation points, wherein the first set of phase values are based on a set of circuit elements of the multi-instance blocks, the output file, and a first set of context information, the first set of context information based, at least in part, on first one or more elements of the circuit design outside the first instance;

calculating, for a second instance of the multi-instance block, a second set of phase values comprising a second corresponding phase value for each propagation point of the plurality of propagation points, wherein the second set of phase values are based on the set of circuit elements of the multi-instance blocks, the output view analysis file, and a second set of context information, the second set of context information based, at least in part, on second one or more elements of the circuit design outside the second instance; and analyzing the first set of phase values, the second set of phase values, and a set of timing requirements associated with the circuit design;

adjusting the circuit design based on the analysis of the first set of phase values, the second set of phase values, and the set of timing requirements to generate an updated circuit design that meets the set of timing requirements.

13. The system of claim 12 further comprising:

means for fabricating a plurality of integrated circuits based on the updated circuit design as adjusted based on the analysis of the first set of phase values, the second set of phase values, and the set of timing requirements.

14. A non-transitory computer readable medium comprising instructions that, when executed by one or more processors of a computing device, cause the device to perform operations comprising:

accessing a first circuit design, the first circuit design comprising a plurality of instances of a first block, a plurality of multi-mode multi-corner (MMMC) views, and one or more timing requirements;

generating a plurality of timing contexts for the circuit design, each timing context of the plurality of timing contexts being generated from a different combination of an instance of the plurality of instances and an MMMC view of the plurality of MMMC views; and generating an output file comprising a plurality of content MMMC views, the plurality of content MMMC views comprising the plurality of MMMC views and the plurality of timing contexts;

determining a block timing merge threshold for the circuit design;

determining a first phase value for a first propagation point within the circuit design using a first timing context and a first MMMC view from the output file;

determining a second phase value for the first propagation point within the circuit design using a second timing context and a second MMMC view from the output file;

generate a merged phase value by comparing the block timing merge threshold with a difference between the first phase value and the second phase value;

calculating a required time for the first propagation point using the merged phase value; and fabricating semiconductor devices using the circuit design, wherein the hierarchical timing analysis is provided for fabricating the semiconductor devices using the circuit design with the hierarchical timing analysis.

15. The non-transitory medium of claim 14, wherein the instructions cause the device to perform further operations comprising:

determining a plurality of propagation points associated with the first block of the circuit design;

calculating, for a first instance of the first block, a first set of phase values comprising a first corresponding phase value for each propagation point of the plurality of propagation points, wherein the first set of phase values are based on a first timing context for the first instance of the plurality of timing contexts;

calculating, for a second instance of the first block, a second set of phase values comprising a second corresponding phase value for each propagation point of the plurality of propagation points, wherein the second set of phase values are based on a second timing context for the second instance of the plurality of timing contexts; and storing the first set of phase values and the second set of phase values as timing analysis data in a memory of the computing device.

16. The non-transitory medium of claim 15, wherein the timing analysis data comprises one or more tables, wherein a first table of the one or more tables is associated with a first propagation point of the first multi-instance block;
   wherein a first column of the first table is associated with an early arrival time for each instance of the multi-instance block;
   wherein a second column of the first table is associated with a late arrival time for each instance of the multi-instance block; and
   wherein each instance of the multi-instance block for the circuit design is associated with a different row of the first table.

17. The non-transitory medium of claim 14, wherein a total number of output context constraints of the output file equals a total number of MMMC views times a number of instances within the circuit design.

18. The method of claim 1 further comprising calculating a required time for the first propagation point using the merged phase value.

19. The non-transitory medium of claim 14, wherein the instructions cause the device to perform further operations comprising:
   calculating a first slack value for a first instance of the plurality of instances of the first block using the merged phase value; and
   calculating a second slack value for a second instance of the plurality of instances of the first block using the merged phase value;
   wherein generating the merged phase value comprises selecting a later delay value from the first phase value and the second phase value.

20. The non-transitory medium of claim 14, wherein the instructions cause the device to perform further operations comprising:
   performing a first timing analysis using the first phase value and the second phase value in a full accuracy timing analysis mode; and
   performing a second timing analysis using the merged phase value in an estimate timing analysis mode.

* * * * *